(12) United States Patent
Hammerschmidt et al.

(10) Patent No.: US 8,253,413 B2
(45) Date of Patent: Aug. 28, 2012

(54) SYSTEM THAT OBTAINS A SWITCHING POINT WITH THE ENCODER IN A STATIC POSITION

(75) Inventors: Dirk Hammerschmidt, Villach (AT); Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1010 days.

(21) Appl. No.: 12/235,230

(22) Filed: Sep. 22, 2008

(65) Prior Publication Data
US 2010/0072988 A1    Mar. 25, 2010

(51) Int. Cl.
*G01B 7/30* (2006.01)
*G01R 33/00* (2006.01)
(52) U.S. Cl. .................... 324/207.25; 324/173
(58) Field of Classification Search ............ 324/207.25, 324/173
See application file for complete search history.

(56) References Cited

U.S. PATENT DOCUMENTS

| | | | |
|---|---|---|---|
| 4,599,561 A * | 7/1986 | Takahashi et al. ....... 324/207.12 |
| 5,568,048 A | 10/1996 | Schroeder et al. |
| 7,259,551 B2 | 8/2007 | Mock et al. |
| 7,341,257 B2 | 3/2008 | Toth et al. |
| 7,394,247 B1 | 7/2008 | Guo et al. |
| 2001/0021087 A1 | 9/2001 | Guo et al. |
| 2006/0006861 A1 | 1/2006 | Heinze et al. |
| 2007/0217078 A1 | 9/2007 | Neumann et al. |
| 2008/0116886 A1 | 5/2008 | Yamada et al. |

* cited by examiner

*Primary Examiner* — Reena Aurora
(74) *Attorney, Agent, or Firm* — Dicke, Billig & Czaja, PLLC

(57) ABSTRACT

A system including an encoder, multiple sensing elements and control logic. The encoder has a pole pitch and is configured to rotate in a direction of rotation. The multiple sensing elements are situated along the direction of rotation and span at least half the length of the pole pitch. The control logic is configured to receive signals from the multiple sensing elements based on the encoder in a static position and obtain a switching point based on the signals.

22 Claims, 18 Drawing Sheets

SYSTEM THAT OBTAINS A SWITCHING POINT WITH THE ENCODER IN A STATIC POSITION

BACKGROUND

Magnetic field sensors are employed in a wide range of applications including automotive, industrial and consumer applications. Magnetic field sensors can be used in sensors such as proximity sensors, motion sensors, position sensors, speed sensors and angular sensors. Magnetic field sensors include Hall effect sensors and magneto-resistive (XMR) sensors, including sensors such as anisotropic magneto-resistive (AMR) sensors, giant magneto-resistive (GMR) sensors and tunneling magneto-resistive (TMR) sensors.

Magnetic field sensors can be used to obtain speed and position measurements, where the magnetic field sensors detect changes in a magnetic field caused by a moving encoder. Usually, the encoder is an alternating magnetic pole wheel or a ferromagnetic encoder wheel. The alternating magnetic pole wheel is placed next to a magnetic field sensor, which detects polarity changes in the measured magnetic field. The alternating magnetic pole wheel rotates and the magnetic field sensor provides an output signal that indicates a pole has passed by the sensor. The ferromagnetic encoder wheel is placed next to a magnetic field sensor in a standing magnetic field, where the ferromagnetic encoder wheel can be a toothed wheel or a ferromagnetic disc having holes that pass by the magnetic field sensor. The ferromagnetic encoder wheel rotates and deflects the standing magnetic field to create changes in the magnetic field. These changes are measured by the magnetic field sensor via detecting crossings of a switching point between minimum and maximum values.

Often, a magnetic field sensor is calibrated by waiting until a minimum value and a maximum value is obtained via the rotating encoder. A switching point is chosen between these minimum and maximum values. To obtain a switching point before this calibration is complete, a stored value can be read from memory. However, it is difficult to obtain a stored value that yields accurate results over all processes.

Some encoders have regularly spaced segments such as poles, teeth and/or holes and other encoders have irregularly spaced segments. Typically, in the case of a crankshaft sensor system, the encoder includes regularly spaced segments with one exception, such as a missing tooth or a longer magnetic pole. This irregularity indicates a defined position of the crankshaft. From this known position, an angle is calculated by counting the number of edges detected via the magnetic field sensor. The resolution of the system is equal to 360 degrees divided by the number of encoder segments.

To improve resolution, controllers estimate subdivisions by dividing the time between edges into smaller quantities. If the rotational speed of the encoder changes via acceleration or deceleration of the encoder, the estimated subdivisions become less accurate. Corrections can be made by taking into account acceleration or deceleration via comparison of the last segment length and the next to last segment length, i.e. taking the first derivative of the speed, and correcting the estimated subdivisions based on expected changes. Also, higher derivatives of the speed can be taken into account using more and older segment length measurements. However, the age of the derivatives increase with the number of segment lengths used such that the estimated subdivisions are not based on up-to-date information. Also, fabrication tolerances of the encoder lead to different segment lengths and the workload of the controller increases with the complexity of the corrections.

In another effort to improve resolution, manufacturers use more and smaller magnetic poles in the encoder. However, the magnitude of the magnetic field decreases exponentially as the magnetic pole-period decreases, where the magnetic pole-period is one north pole and one south pole in the direction of movement. Thus, as pole-period decreases, the magnetic field decreases exponentially at a given distance from the encoder. This makes it difficult to have a fine resolution encoder and a large air-gap between the encoder and the magnetic field sensor.

For these and other reasons, there is a need for the present invention.

SUMMARY

One embodiment described in the disclosure provides a system including an encoder, multiple sensing elements and control logic. The encoder has a pole pitch and is configured to rotate in a direction of rotation. The multiple sensing elements are situated along the direction of rotation and span at least half the length of the pole pitch. The control logic is configured to receive signals from the multiple sensing elements based on the encoder in a static position and obtain a switching point based on the signals.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that features of the various embodiments described herein may be combined with each other, unless specifically noted otherwise.

Figure 1:
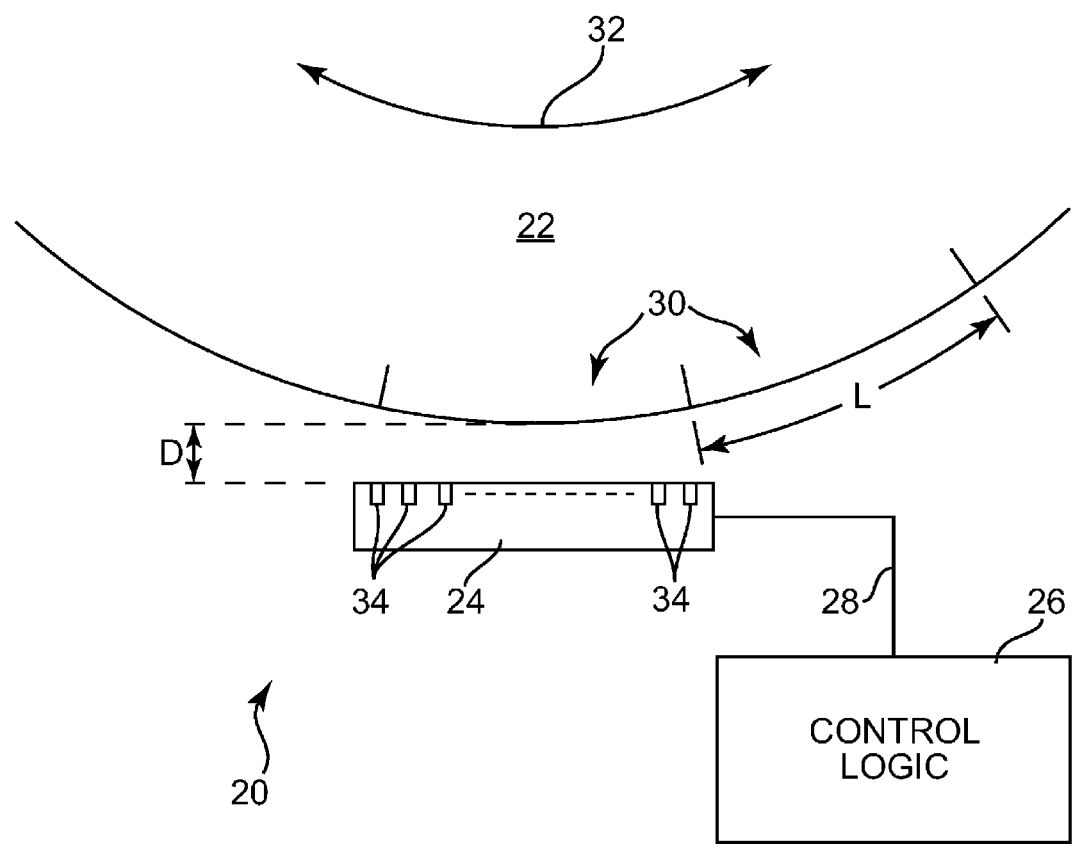
FIG. 1 is a diagram illustrating one embodiment of a sensor system that detects the position and motion of an encoder via magnetic fields.

FIG. 1 is a diagram illustrating one embodiment of a sensor system 20 that detects the position and motion of encoder 22 via magnetic fields. System 20 includes encoder 22, sensor circuit 24 and control logic 26. Sensor circuit 24 is situated a distance D from encoder 22 and electrically coupled to control logic 26 via communications path 28. In one embodiment, sensor circuit 24 and control logic 26 are part of the same semiconductor chip. In one embodiment, sensor circuit 24 and control logic 26 are on separate semiconductor chips.

Encoder 22 includes encoder segments 30 that provide or influence the magnetic field sensed by sensor circuit 24. Encoder 22 moves in relation to sensor circuit 24, which changes the magnetic field between encoder 22 and sensor circuit 24. The direction of movement of encoder 22 is indicated at 32. In one embodiment, each of the encoder segments 30 is a magnetic north pole or a magnetic south pole. In one embodiment, each of the encoder segments 30 is a tooth or a space between teeth.

Sensor circuit 24 includes multiple sensing elements 34 aligned along the direction of movement of encoder 22. Each of the multiple sensing elements 34 senses the magnetic field between encoder 22 and sensor circuit 24 and each provides sensed signals based on the sensed magnetic field. In one embodiment, sensing elements 34 include Hall effect sensing elements. In one embodiment, sensing elements 34 include XMR sensing elements. In one embodiment, sensing elements 34 include AMR sensing elements. In one embodiment, sensing elements 34 include GMR sensing elements. In one embodiment, sensing elements 34 include TMR sensing elements.

Control logic 26 receives the sensed signals from the multiple sensing elements 34 via communications path 28. Control logic 26 processes the sensed signals to provide position and speed measurements.

In a first implementation, encoder 22 has an axis of rotation that extends out of the page and each of the encoder segments 30 has a length L in the direction of rotation, around the circumference of encoder 22. The pole-pitch of encoder 22 is equal to two times the length L. Sensor circuit 24 includes multiple sensing elements 34 situated along the direction of rotation and spanning at least half the length of the pole pitch. In one embodiment, encoder segments 30 are alternating north and south poles of the same length L. In one embodiment, encoder segments 30 are alternating tooth and space segments of the same length L. In one embodiment, sensor circuit 24 includes at least three sensing elements 34. In one embodiment, sensor circuit 24 includes at least eight sensing elements 34. In one embodiment, sensor circuit 24 includes at least eleven sensing elements 34.

Control logic 26 receives the sensed signals from multiple sensing elements 34 and processes the sensed signals to provide position and speed measurements. In one embodiment, control logic 26 receives the sensed signals from multiple sensing elements 34 with encoder 24 in a static position, i.e. not moving, and control logic 26 obtains a switching point based on these sensed signals. In one embodiment, control logic 26 adjusts the switching point based on minimum and maximum sensed signals obtained from multiple sensing elements 34 via rotation of encoder 22. In one embodiment, control logic 26 adds delays to sensed signal edges based on the lengths of the encoder segments 30 and provides an adjusted or corrected signal. In one embodiment, control logic 26 shifts a switching point spatial reference in the multiple sensing elements 34 to provide a corrected signal. In one embodiment, control logic 26 interpolates between sensed signals from adjacent sensing elements 34 to provide a smaller pitch than the pitch between the adjacent sensing elements 34.

In a second implementation, encoder 22 has an axis of rotation that extends out of the page and at least some of the encoder segments 30 have different lengths in the direction of rotation, around the circumference of encoder 22. Sensor circuit 24 includes multiple sensing elements 34 situated along the direction of rotation, which provide a series of signals as one of the encoder segments 30 rotates past the multiple sensing elements 34. In one embodiment, encoder segments 30 are alternating north and south poles. In one embodiment, encoder segments 30 are alternating tooth and space segments. In one embodiment, sensor circuit 24 includes at least three sensing elements 34. In one embodiment, sensor circuit 24 includes at least eight sensing elements 34. In one embodiment, sensor circuit 24 includes at least eleven sensing elements 34.

Control logic 26 receives sensed signals from multiple sensing elements 34 and processes the sensed signals to provide position and speed measurements. In one embodiment, control logic 26 receives the series of signals and provides subtics between a last signal in the series of signals and a first signal in the next series of signals. In one embodiment, control logic 26 provides subtics based on the series of signals and measurement(s) of the velocity of rotation of encoder 22. In one embodiment, control logic 26 provides subtics based on the series of signals and measurement(s) of at least one of the acceleration and the change in the acceleration of rotation of encoder 22. In one embodiment, control logic 26 provides subtics based on the series of signals and averages of measurements, such as velocity, acceleration and the change in the acceleration of rotation of encoder 22. In one embodiment, control logic 26 encodes an output signal including subtics via a coding system, such as manchester coding or multilevel coding.

In a third implementation, encoder 22 has an axis of rotation that extends out of the page. Sensor circuit 24 includes multiple sensing elements 34 situated along the direction of rotation, and a first sensing element is situated radially further from the axis of rotation than a second sensing element. In one embodiment, encoder segments 30 are alternating north and south poles. In one embodiment, encoder segments 30 are alternating tooth and space segments.

In one embodiment, the first sensing element and the second sensing element are situated along the same radius from the axis of rotation. In one embodiment, sensor circuit 24 includes pairs of sensing elements 34, where each of the pairs of sensing elements 34 includes one sensing element that is radially further from the axis of rotation than the other sensing element. In one embodiment, each of the encoder segments 30 has a length L in the direction of rotation, around the circumference of encoder 22, and the pole-pitch of encoder 22 is equal to two times the length L, and pairs of sensing elements 34 are situated along the direction of rotation such that a first pair of sensing elements 34 and a last pair of sensing elements 34 are spaced apart less than or equal to a quarter of the length of the pole pitch.

Figure 2:
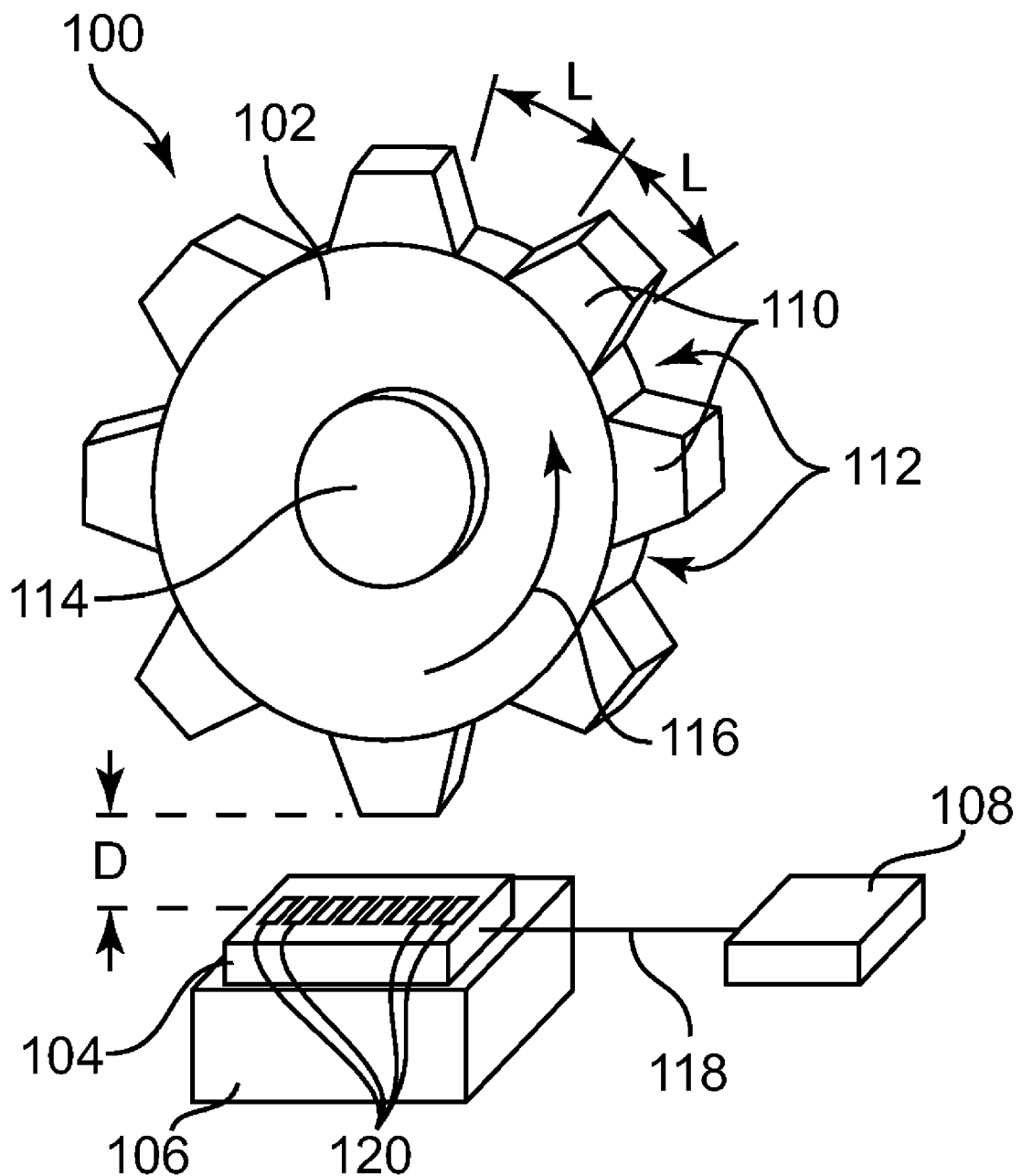
FIG. 2 is a diagram illustrating one embodiment of a sensor system including a toothed encoder wheel.

FIG. 2 is a diagram illustrating one embodiment of a sensor system 100 including a toothed encoder wheel 102. System 100 includes encoder wheel 102, sensor circuit 104, a magnet 106 and control logic 108. Magnet 106 is situated under sensor circuit 104 and provides a magnetic field between encoder wheel 102 and sensor circuit 104. System 100 detects the position and motion of encoder wheel 102 via deflection of the magnetic field by encoder wheel 102. Sensor system 100 is similar to sensor system 20.

Encoder wheel 102 includes teeth segments 110 and space segments 112 and has an axis of rotation that extends out of the page at 114. Encoder wheel 102 rotates in the direction of rotation indicated at 116. Each of the teeth and space segments 110 and 112 has a length L in the direction of rotation, around the circumference of encoder wheel 102, such that the pole-pitch of encoder wheel 102 is equal to two times the length L. Encoder wheel 102, including teeth segments 110, includes a ferromagnetic material that deflects the magnetic field between encoder wheel 102 and sensor circuit 104. The alternating teeth and space segments 110 and 112 produce a cyclical waveform in the signals sensed via sensor circuit 104. One cycle of this waveform is produced by a combination of one of the teeth segments 110 and one of the space segments 112.

Sensor circuit 104 is situated a distance D from teeth segments 110 and the outer circumference of encoder wheel 102. Also, sensor circuit 104 is electrically coupled to control logic 108 via communications path 118. In one embodiment, sensor circuit 104 and control logic 108 are part of the same semiconductor chip. In one embodiment, sensor circuit 104 and control logic 108 are on separate semiconductor chips.

Sensor circuit 104 includes multiple sensing elements 120 situated along the direction of rotation of encoder wheel 102 and spanning at least half the length of the pole pitch, i.e. at least one segment length L. Each of the multiple sensing elements 120 senses the magnetic field between encoder wheel 102 and sensor circuit 104 and each provides sensed signals based on the sensed magnetic field. In one embodiment, sensing elements 120 include Hall effect sensing elements. In one embodiment, sensing elements 120 include XMR sensing elements. In one embodiment, sensing elements 120 include AMR sensing elements. In one embodiment, sensing elements 120 include GMR sensing elements. In one embodiment, sensing elements 120 include TMR sensing elements. In one embodiment, sensor circuit 104 includes at least three sensing elements 120. In one embodiment, sensor circuit 104 includes at least eight sensing elements 120. In one embodiment, sensor circuit 104 includes at least eleven sensing elements 120.

Control logic 108 receives the sensed signals from the multiple sensing elements 120 via communications path 118 and processes the sensed signals to provide position and speed measurements. With encoder wheel 102 in a static position, i.e. not moving, the multiple sensing elements 120 sense the magnetic field spanning at least one segment length L. These sensed signals represent at least one half cycle of the waveform produced by a combination of one of the teeth segments 110 and one of the space segments 112. From these sensed signals, control logic 108 obtains a switching point, such as the midpoint between minimum and maximum values of one cycle of the sensed signals. Control logic 108 uses the switching point to obtain sensed signal edges and from these signal edges obtains position and speed measurements.

In one embodiment, control logic 108 adjusts the switching point obtained via the static encoder wheel 102, by storing minimum and maximum sensed signal values from the multiple sensing elements 120 as encoder wheel 102 rotates, and refining the switching point based on these stored minimum and maximum values.

The fabrication tolerance of sensor circuit 104 is much tighter than the fabrication tolerance of the teeth and space segments 110 and 112 of encoder wheel 102. With multiple sensing elements 120 that span at least one segment length L, the length of each of the teeth segments 110 and the length of each of the space segments 112 can be measured. Using these length measurements, control logic 108 adjusts the signal edges to provide a corrected signal and obtain corrected position and speed measurements of encoder wheel 102. This corrects for fabrication tolerance errors in encoder wheel 102.

In one embodiment, control logic 108 provides rising and falling edges in response to the sensed signal waveform crossing the switching point. Control logic 108 adds delays to the sensed signal edges based on the lengths of the teeth and space segments 110 and 112 that provided the sensed signal edges. Control logic 108 adjusts the sensed signal edges to provide an adjusted or corrected output signal that has high and low phases of equal length.

In one embodiment, control logic 108 provides rising and falling edges in response to the sensed signal waveform crossing a switching point that is spatially referenced to one of the multiple sensing elements 120. Control logic 108 shifts the switching point spatial reference in the multiple sensing elements 120 to provide a corrected signal.

In one embodiment, control logic 108 receives the sensed signals from each of the multiple sensing elements 120 and interpolates between sensed signals from adjacent sensing elements 120 to provide a smaller division or pitch than the pitch between the adjacent sensing elements 120.

Figure 3:
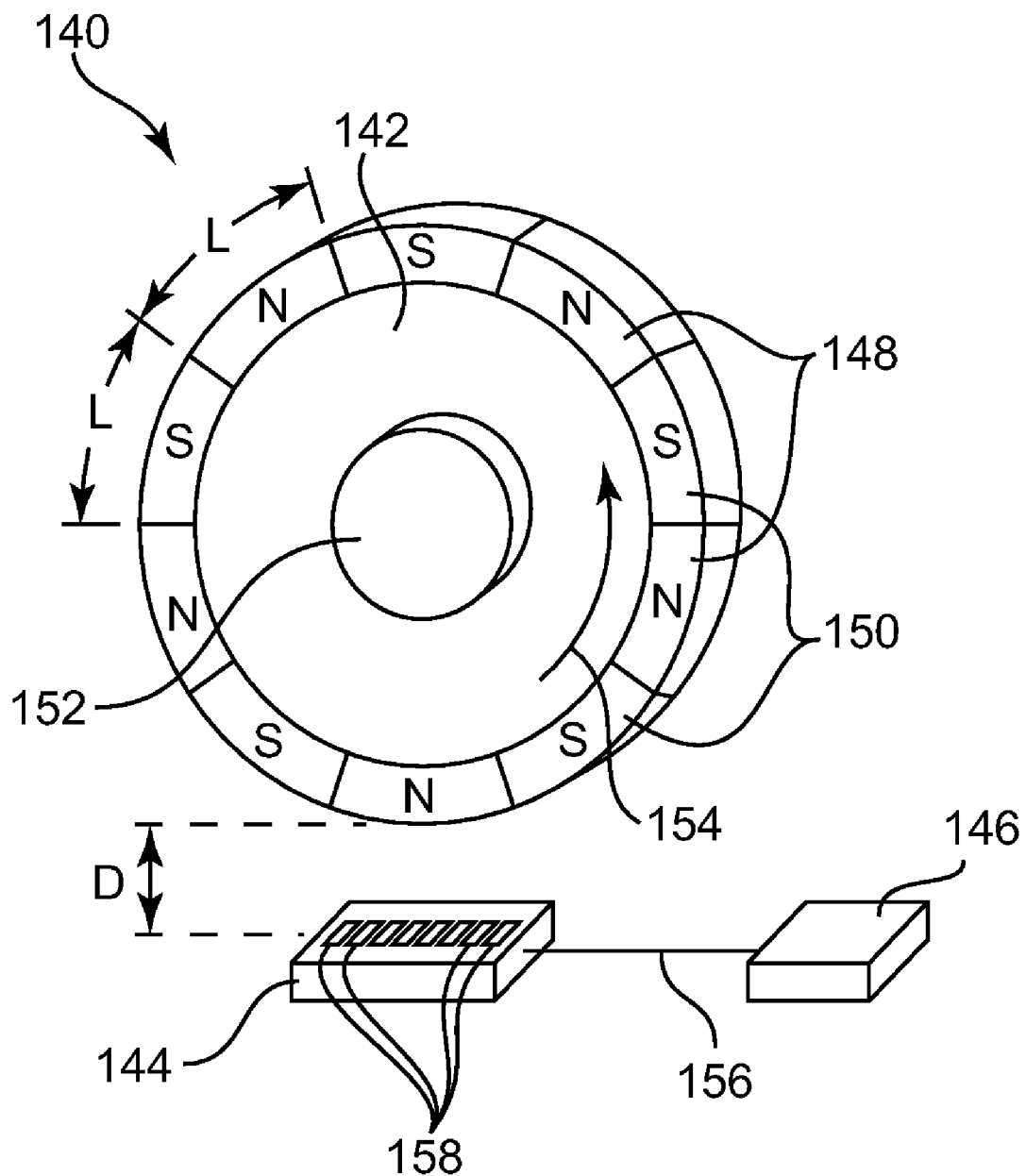
FIG. 3 is a diagram illustrating one embodiment of a sensor system including a magnetic encoder wheel.

FIG. 3 is a diagram illustrating one embodiment of a sensor system 140 including a magnetic encoder wheel 142. System 140 includes encoder wheel 142, sensor circuit 144 and control logic 146. Encoder wheel 142 provides a magnetic field between encoder wheel 142 and sensor circuit 144. System 140 detects the position and motion of encoder wheel 142 via differences in the magnetic field over the length of sensor circuit 144 and changes in the magnetic field as encoder wheel 142 rotates. Sensor system 140 is similar to sensor system 100.

Encoder wheel 142 includes north pole segments 148 and south pole segments 150 and has an axis of rotation that extends out of the page at 152. Encoder wheel 142 rotates in the direction of rotation indicated at 154. Each of the north pole segments 148 and each of the south pole segments 150 has a length L in the direction of rotation, around the circumference of encoder wheel 142, such that the pole-pitch of encoder wheel 142 is equal to two times the length L. The alternating north and south pole segments 148 and 150 produce a cyclical waveform in the signals sensed via sensor circuit 144. One cycle of this waveform is produced by a combination of one north pole and one south pole.

Sensor circuit 144 is situated a distance D from north and south pole segments 148 and 150 and the outer circumference of encoder wheel 142. Also, sensor circuit 144 is electrically coupled to control logic 146 via communications path 156. In one embodiment, sensor circuit 144 and control logic 146 are part of the same semiconductor chip. In one embodiment, sensor circuit 144 and control logic 146 are on separate semiconductor chips.

Sensor circuit 144 includes multiple sensing elements 158 situated along the direction of rotation of encoder wheel 142 and spanning at least half the length of the pole pitch, i.e. at least one segment length L. Each of the multiple sensing elements 158 senses the magnetic field between encoder wheel 142 and sensor circuit 144 and each provides sensed signals based on the sensed magnetic field. In one embodiment, sensing elements 158 include Hall effect sensing elements. In one embodiment, sensing elements 158 include XMR sensing elements. In one embodiment, sensing elements 158 include AMR sensing elements. In one embodiment, sensing elements 158 include GMR sensing elements. In one embodiment, sensing elements 158 include TMR sensing elements. In one embodiment, sensor circuit 144 includes at least three sensing elements 158. In one embodiment, sensor circuit 144 includes at least eight sensing elements 158. In one embodiment, sensor circuit 144 includes at least eleven sensing elements 158.

Control logic 146 receives the sensed signals from the multiple sensing elements 158 via communications path 156 and processes the sensed signals to provide position and speed measurements. With encoder wheel 142 in a static position, i.e. not moving, the multiple sensing elements 158 sense the magnetic field spanning at least one segment length L. These sensed signals represent at least one half cycle of the waveform produced by a combination of one north pole and one south pole. From these sensed signals, control logic 146 obtains a switching point, such as the midpoint between minimum and maximum values of one cycle of the sensed signals. Control logic 146 uses the switching point to obtain sensed signal edges and from these signal edges obtains position and speed measurements.

In one embodiment, control logic 146 adjusts the switching point obtained via the static encoder wheel 142, by storing minimum and maximum sensed signal values from the multiple sensing elements 158 as encoder wheel 142 rotates, and refining the switching point based on these stored minimum and maximum values.

The fabrication tolerance of sensor circuit 144 is much tighter than the fabrication tolerance of the north and south pole segments 148 and 150. With multiple sensing elements 158 that span at least one segment length L, the length of each of the north and south pole segments 148 and 150 can be measured. Using these length measurements, control logic 146 adjusts the signal edges to provide a corrected signal and obtain corrected position and speed measurements of encoder wheel 142. This corrects for fabrication tolerance errors in encoder wheel 142.

In one embodiment, control logic 146 provides rising and falling edges in response to a sensed signal waveform crossing the switching point. Control logic 146 adds delays to the sensed signal edges based on the lengths of the north and south pole segments 148 and 150 that provided the sensed signal edges. Control logic 146 adjusts the sensed signal edges to provide an adjusted or corrected output signal that has high and low phases of equal length.

In one embodiment, control logic 146 provides rising and falling edges in response to the sensed signal waveform crossing a switching point that is spatially referenced to one of the multiple sensing elements 158. Control logic 146 shifts the switching point spatial reference in the multiple sensing elements 158 to provide a corrected signal.

In one embodiment, control logic 146 receives the sensed signals from each of the multiple sensing elements 158 and interpolates between sensed signals from adjacent sensing elements 158 to provide a smaller division or pitch than the pitch between the adjacent sensing elements 158.

FIGS. 4-7 are graphs illustrating sensed signals of one embodiment of a sensor system, such as sensor system 100 or sensor system 140, with the encoder wheel at rest or static. The sensor system includes eleven sensing elements situated along the direction of rotation of the encoder wheel and spanning one segment length L. Each dot represents a sensor signal from one of the eleven sensing elements. In one embodiment, the sensor system is similar to sensor system 100, where the sensing elements are similar to sensing elements 120 and the encoder wheel is similar to toothed encoder wheel 102. In one embodiment, the sensor system is similar to sensor system 140, where the sensing elements are similar to sensing elements 158 and the encoder wheel is similar to magnetic encoder wheel 142.

The sensing elements sense a half cycle of the waveform produced by two encoder wheel segments, such as one tooth segment and one space segment or one north pole segment and one south pole segment. A switching point is obtained from these sensed signals, with the encoder wheel at rest or static. Thus, a switching point is obtained without rotating the encoder wheel. If the encoder wheel starts to move, encoder movement speed and direction are immediately detected via the sensing elements and the switching point.

Figure 4:
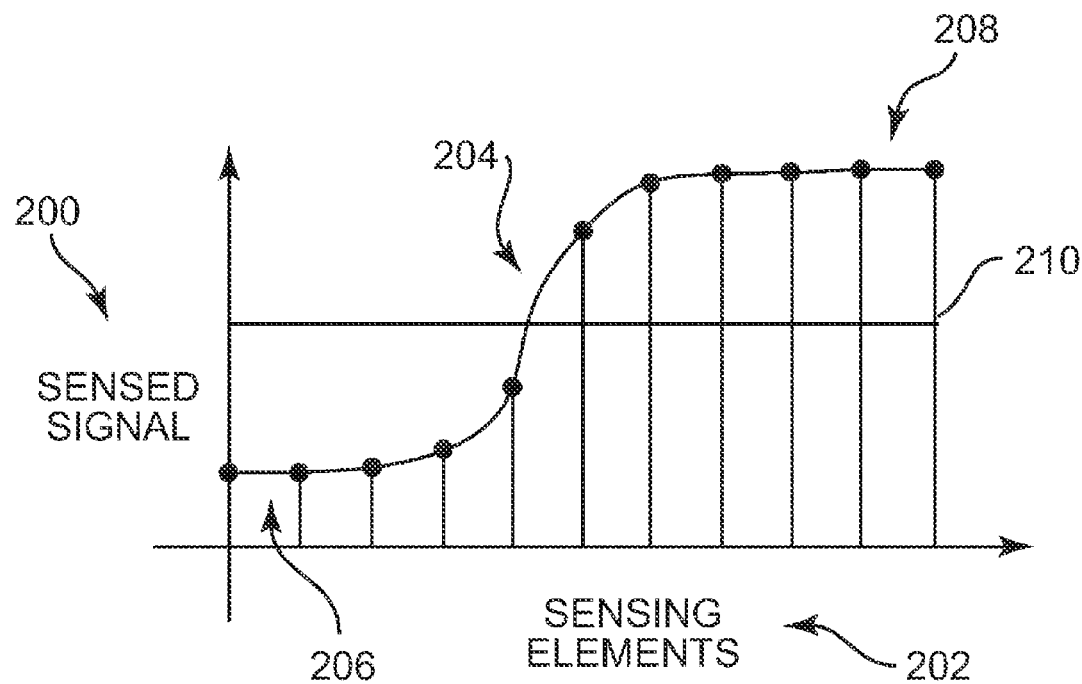
FIG. 4 is a graph illustrating sensed signals versus sensing elements with the encoder wheel statically positioned such that the sensing elements observe a cross-over.

FIG. 4 is a graph illustrating sensed signals at 200 versus sensing elements at 202 with the encoder wheel statically positioned such that the sensing elements observe a crossover at 204. The crossover at 204 is provided via the segments in the encoder wheel. In one embodiment, a cross-over takes place at each of the segment edges. In one embodiment, a cross-over takes place in the middle of each of the segments.

At 206, the sensed signals are at a minimum and at 208 the sensed signals are at a maximum. The switching point at 210 is obtained from these minimum and maximum values. In one embodiment, the midpoint between the minimum and maximum values is used for the switching point at 210.

Figure 5:
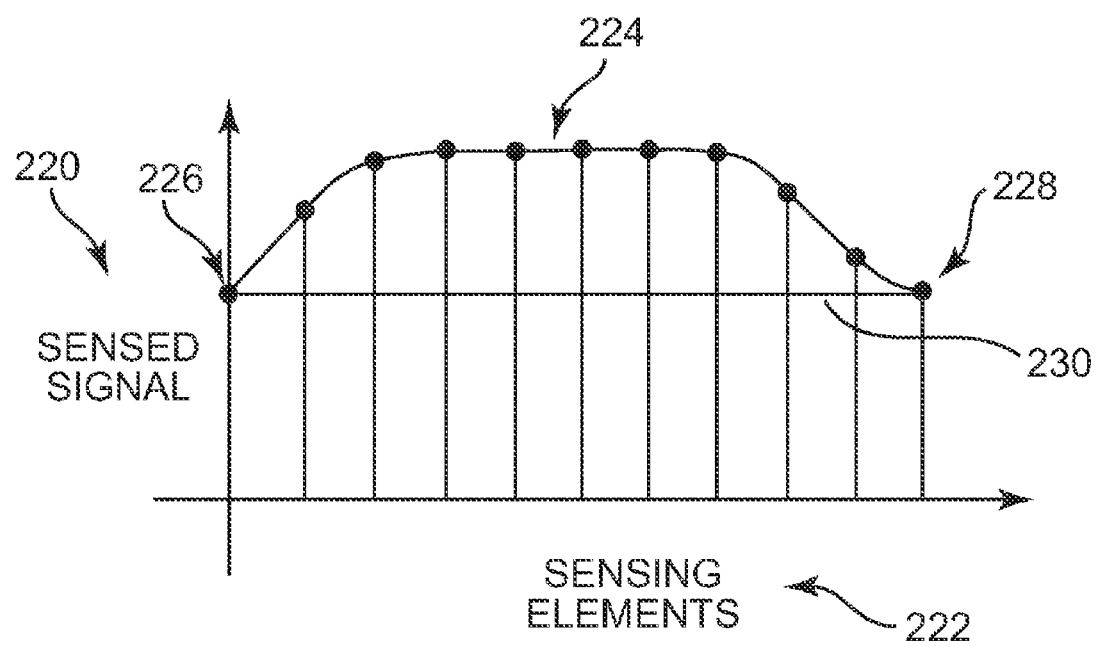
FIG. 5 is a graph illustrating sensed signals versus sensing elements with the encoder wheel statically positioned such that the sensing elements observe a maximum.

FIG. 5 is a graph illustrating sensed signals at 220 versus sensing elements at 222 with the encoder wheel statically positioned such that the sensing elements observe a maximum at 224. The maximum at 224 is provided via the segments in the encoder wheel. In one embodiment, a maximum takes place at alternating segment edges. In one embodiment, a maximum takes place in the middle of alternating segments.

At 226, the sensed signals are substantially at a cross-over point, and at 228, the sensed signals are substantially at another crossover point. The switching point at 230 is obtained from these cross-over points. In one embodiment, the average of the cross-over points at 226 and 228 is used for the switching point at 230. In one embodiment, the maximum value is stored and the switching point at 230 is adjusted after the encoder wheel rotates to provide a sensed minimum value, where the midpoint between the minimum and maximum values is used for the switching point at 230.

Figure 6:
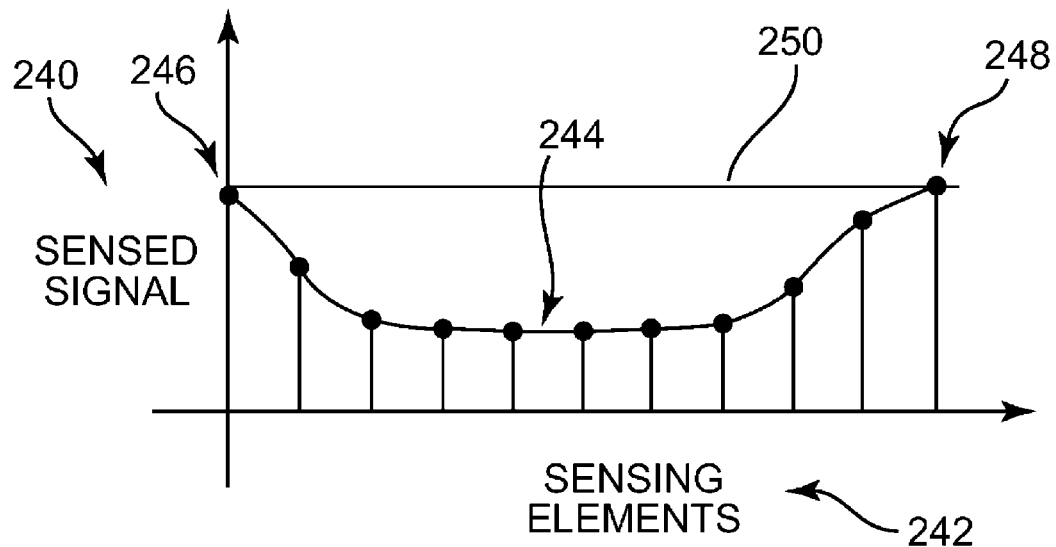
FIG. 6 is a graph illustrating sensed signals versus sensing elements with the encoder wheel statically positioned such that the sensing elements observe a minimum.

FIG. 6 is a graph illustrating sensed signals at 240 versus sensing elements at 242 with the encoder wheel statically positioned such that the sensing elements observe a minimum at 244. The minimum at 244 is provided via the segments in the encoder wheel. In one embodiment, a minimum takes place at alternating segment edges. In one embodiment, a minimum takes place in the middle of alternating segments.

At 246, the sensed signals are substantially at a cross-over point and at 248 the sensed signals are substantially at another crossover point. The switching point at 250 is obtained from these cross-over points. In one embodiment, the average of the cross-over points at 246 and 248 is used for the switching point at 250. In one embodiment, the minimum value is stored and the switching point at 250 is adjusted after the encoder wheel rotates to provide a sensed maximum value; where the midpoint between the minimum and maximum values is used for the switching point at 250.

Figure 7:
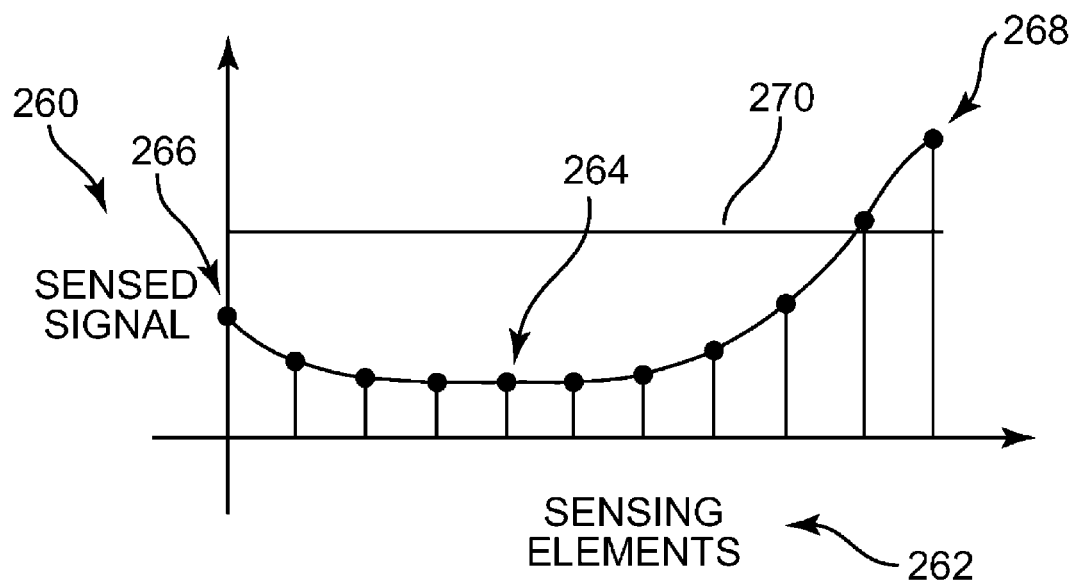
FIG. 7 is a graph illustrating sensed signals versus sensing elements with the encoder wheel statically positioned such that the sensing elements observe an asymmetrical signal.

FIG. 7 is a graph illustrating sensed signals at 260 versus sensing elements at 262 with the encoder wheel statically positioned such that the sensing elements observe an asymmetrical signal including a minimum at 264. The minimum at 264 is provided via the segments in the encoder wheel. In one embodiment, a minimum takes place at alternating segment edges. In one embodiment, a minimum takes place in the middle of alternating segments.

At 266, the sensed signals are below a cross-over point, and at 268, the sensed signals are above another crossover point. The switching point at 270 is obtained from these sensed signals at 266 and 268. In one embodiment, the average of the sensed signals at 266 and 268 is used for the switching point at 270.

In other embodiments, sensing elements in the sensor system span more than one segment length L. A switching point can be calculated based on sensing elements that span one segment length, or if sensing elements span two segment lengths L, the sensed minimum and maximum values can be used to determine the switching point.

Figure 8:
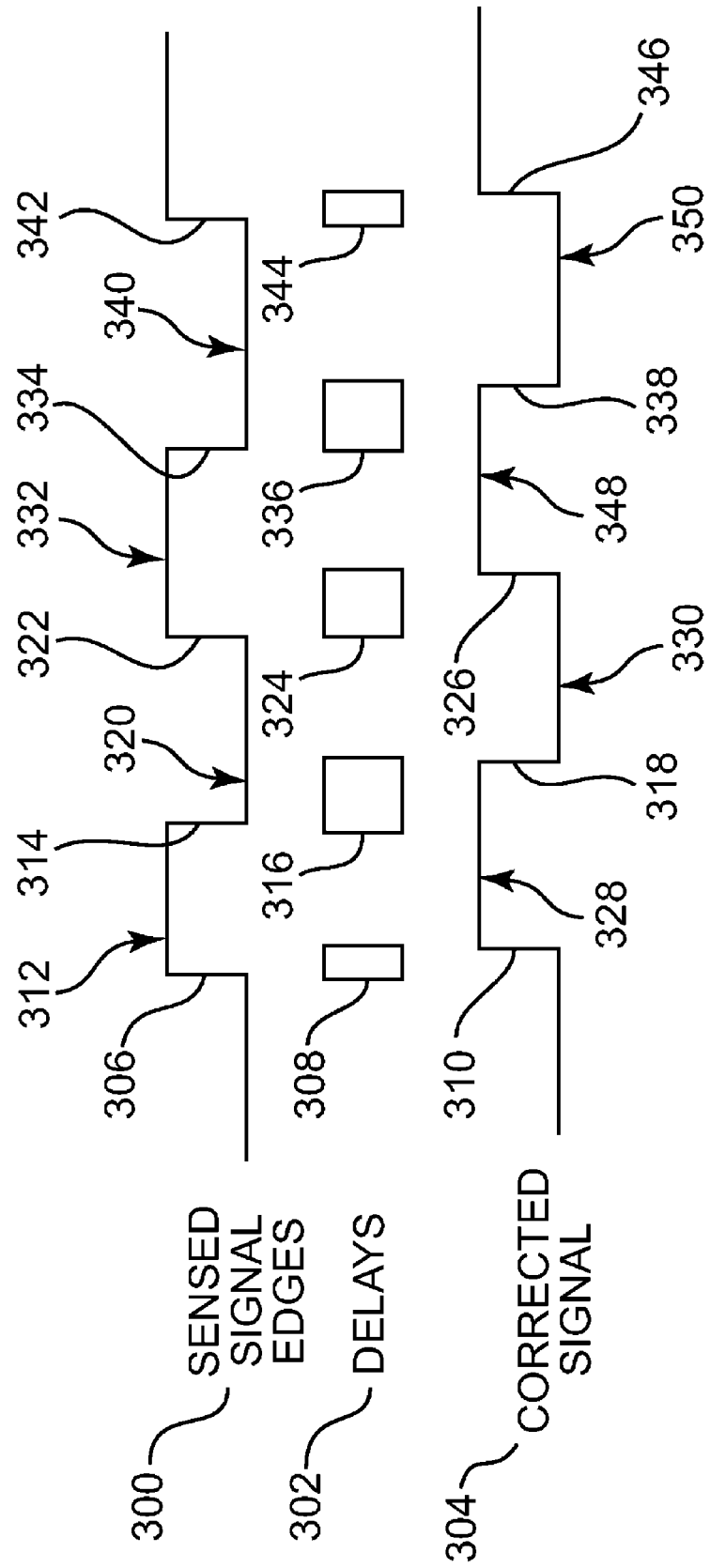
FIG. 8 is a timing diagram illustrating sensed signal edges and delays that are added to the sensed signal edges to provide a corrected signal.

FIG. 8 is a timing diagram illustrating sensed signal edges 300 and delays 302 that are added to the sensed signal edges 300 to provide corrected signal 304. Control logic adds delays 302 to the sensed signal edges 300 based on the lengths of the encoder segments that produced the sensed signal edges 300 and provides the adjusted or corrected signal 304. In one embodiment, the control logic is similar to control logic 26. In one embodiment, the control logic is similar to control logic 108. In one embodiment, the control logic is similar to control logic 146.

The fabrication tolerance of sensor circuits, such as sensor circuits 24, 104 and 144, is much tighter than the fabrication tolerance of encoder segments of an encoder, such as encoder segments 30 of encoder 22, teeth and space segments 110 and 112 of encoder wheel 102 and north and south pole segments 148 and 150 of encoder wheel 142. Multiple sensing elements, such as sensing elements 34, 120 and 158, span at least one segment length L and the length of each of the encoder segments is measured and stored. Using these length measurements, the control logic adjusts the sensed signal edges 300 via delays 302 to provide corrected signal 304. Control logic obtains corrected position and speed measurements of the encoder via corrected signal 304.

The control logic receives sensed signals from multiple sensing elements and provides sensed signal edges at 300 in response to one or more of the sensed signals crossing the switching point. The control logic adds delays 302 to the sensed signal edges 300 based on the lengths of the encoder segments that provided the sensed signal edges 300. The corrected signal 304 has high and low phases of equal length. In one embodiment, the delays at 302 are provided via a timer. In one embodiment, the delays at 302 are provided via a timer that adjusts itself to the rotational speed of the encoder using a phase locked loop (PLL).

For example, the control logic provides a rising edge at 306 in the sensed signal edges 300 in response to a sensed signal crossing the switching point. Control logic adds a standard delay at 308 to the rising edge at 306 to provide the rising edge at 310 in corrected signal 304. The standard delay at 308 is initially provided to allow for later reducing a delay in the event that a long segment comes first. In this example, the high phase at 312 is short and control logic provides a falling edge at 314 in the sensed signal edges 300 in response to a sensed signal crossing the switching point. Next, control logic adds a longer delay at 316 to the falling edge at 314 to provide the falling edge at 318 in corrected signal 304. The low phase at 320 in the sensed signal edges at 300 is slightly longer than average and control logic provides the rising edge at 322 and adds a delay at 324 that is slightly less than the delay at 316 to provide the rising edge at 326 in corrected signal 304. Corrected signal 304 includes the corrected high phase at 328 and the corrected low phase at 330, such that the high and low phases are of equal length.

The next high phase at 332 in the sensed signal edges 300 has a substantially suitable length and control logic provides the falling edge at 334 and adds a delay at 336 that is substantially the same as the delay at 324 to provide the rising edge at 338 in corrected signal 304. The next low phase at 340 in the sensed signal edges 300 is long and control logic provides the rising edge at 342 in the sensed signal edges 300 and adds a shorter delay at 344, which is much less than the delay at 336 to provide the rising edge at 346 in corrected signal 304. Corrected signal 304 includes the corrected high phase at 348 and the corrected low phase at 350, such that the high and low phases are of equal length. This process continues and control logic obtains corrected position and speed measurements using corrected signal 304, which corrects for fabrication tolerance errors in the encoder.

Figure 9:
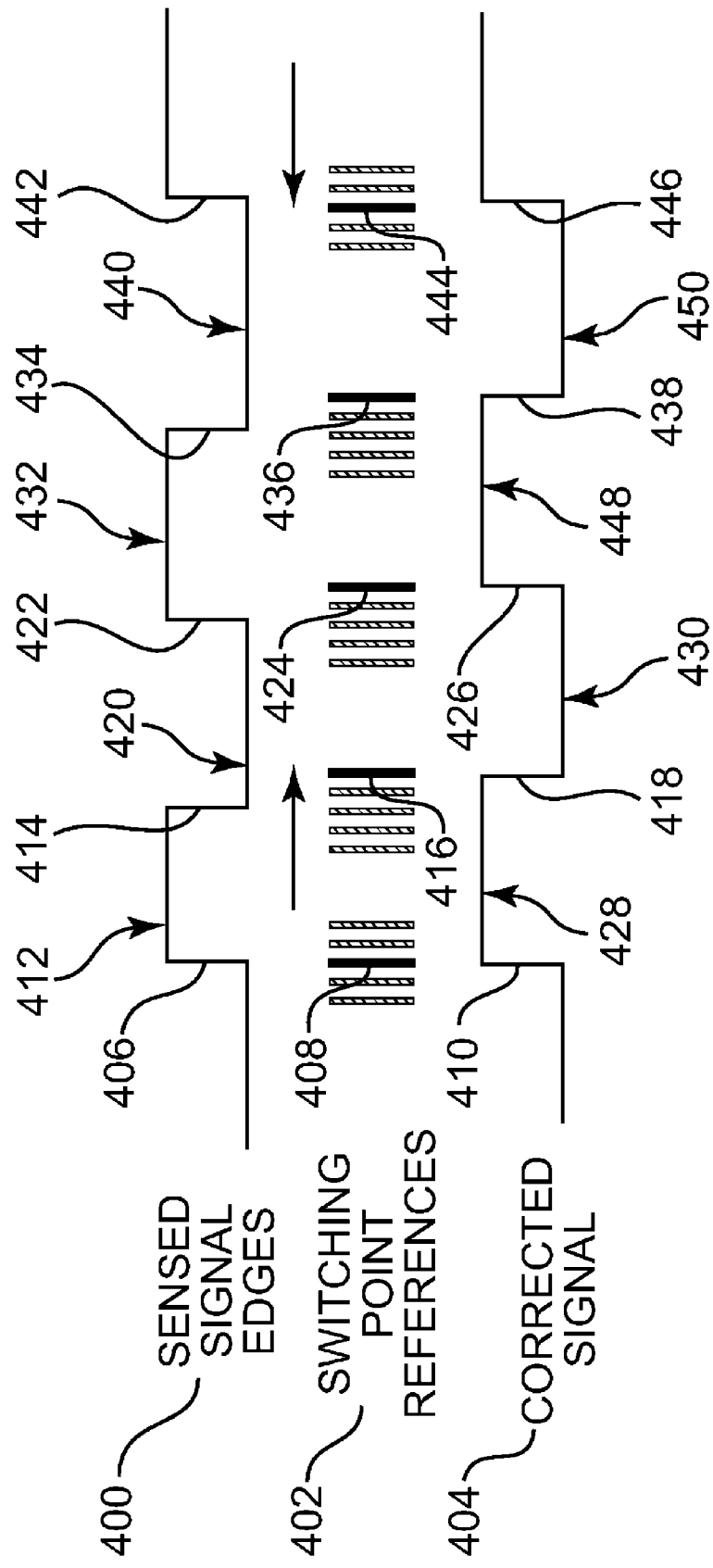
FIG. 9 is a diagram illustrating sensed signal edges and switching point references that are selected to provide a corrected signal.

FIG. 9 is a diagram illustrating sensed signal edges 400 and switching point references 402 that are selected to provide corrected signal 404. Switching point references 402 are the multiple sensing elements in the sensor circuit, where one of the sensing elements is selected to provide the sensed signal that is used to provide edges in corrected signal 404. Control logic shifts the selected switching point spatial reference at 402 from one sensing element to another sensing element to provide positive and negative delays from sensed signal edges 400. Control logic shifts the selected switching point spatial reference at 402 based on the lengths of the encoder segments that produce the sensed signal edges 400. In one embodiment, the control logic is similar to control logic 26. In one embodiment, the control logic is similar to control logic 108. In one embodiment, the control logic is similar to control logic 146.

The fabrication tolerance of sensor circuits, such as sensor circuits 24, 104 and 144, is much tighter than the fabrication tolerance of encoder segments of an encoder, such as encoder segments 30 of encoder 22, teeth and space segments 110 and 112 of encoder wheel 102 and north and south pole segments 148 and 150 of encoder wheel 142. Multiple sensing elements, such as sensing elements 34, 120 and 158, span at least one segment length L and the length of each of the encoder segments is measured and stored. Using these length measurements, control logic shifts the switching point spatial reference at 402 to provide corrected signal 404. Control logic obtains corrected position and speed measurements of the encoder via corrected signal 404.

The control logic receives sensed signals from multiple sensing elements and provides sensed signal edges at 400. The control logic shifts the switching point spatial reference at 402 form one sensing element to another sensing element based on the lengths of the encoder segments that provided the sensed signal edges 400. The control logic provides rising and falling edges in corrected signal 404 in response to the sensed signal from the selected sensing element at 402 crossing the switching point. The corrected signal 404 has high and low phases of equal length.

For example, the control logic provides a rising edge at 406 in the sensed signal edges 400. Based on the switching point reference at 408, control logic provides a rising edge at 410 in corrected signal 404. In this example, the high phase at 412 is short and control logic provides a falling edge at 414 in sensed signal edges 400. Next, control logic shifts the switching point reference to the right two sensing elements to the switching point reference at 416 and provides a falling edge at 418 in corrected signal 404. The low phase at 420 in sensed signal edges 400 is a substantially suitable length and control logic provides the rising edge at 422. Based on the switching point reference at 424, which is the same switching point reference previously used, control logic provides the rising edge at 426 in corrected signal 404. Corrected signal 404 includes the corrected high phase at 428 and the corrected low phase at 430, such that the high and low phases are of equal length.

The next high phase at 432 in sensed signal edges 400 has a substantially suitable length and control logic provides the falling edge at 434. Based on the switching point reference at 436, which is the same switching point reference previously used, control logic provides the falling edge at 438 in corrected signal 404. The next low phase at 440 in the sensed signal edges 400 is long and control logic provides the rising edge at 442. Control logic shifts the switching point reference to the left two sensing elements to the switching point reference at 444 and provides a rising edge at 446 in corrected signal 404. Corrected signal 404 includes the corrected high phase at 448 and the corrected low phase at 450, such that the high and low phases are of equal length. This process continues and control logic obtains corrected position and speed measurements using corrected signal 404, which corrects for fabrication tolerance errors in the encoder.

Figure 10:
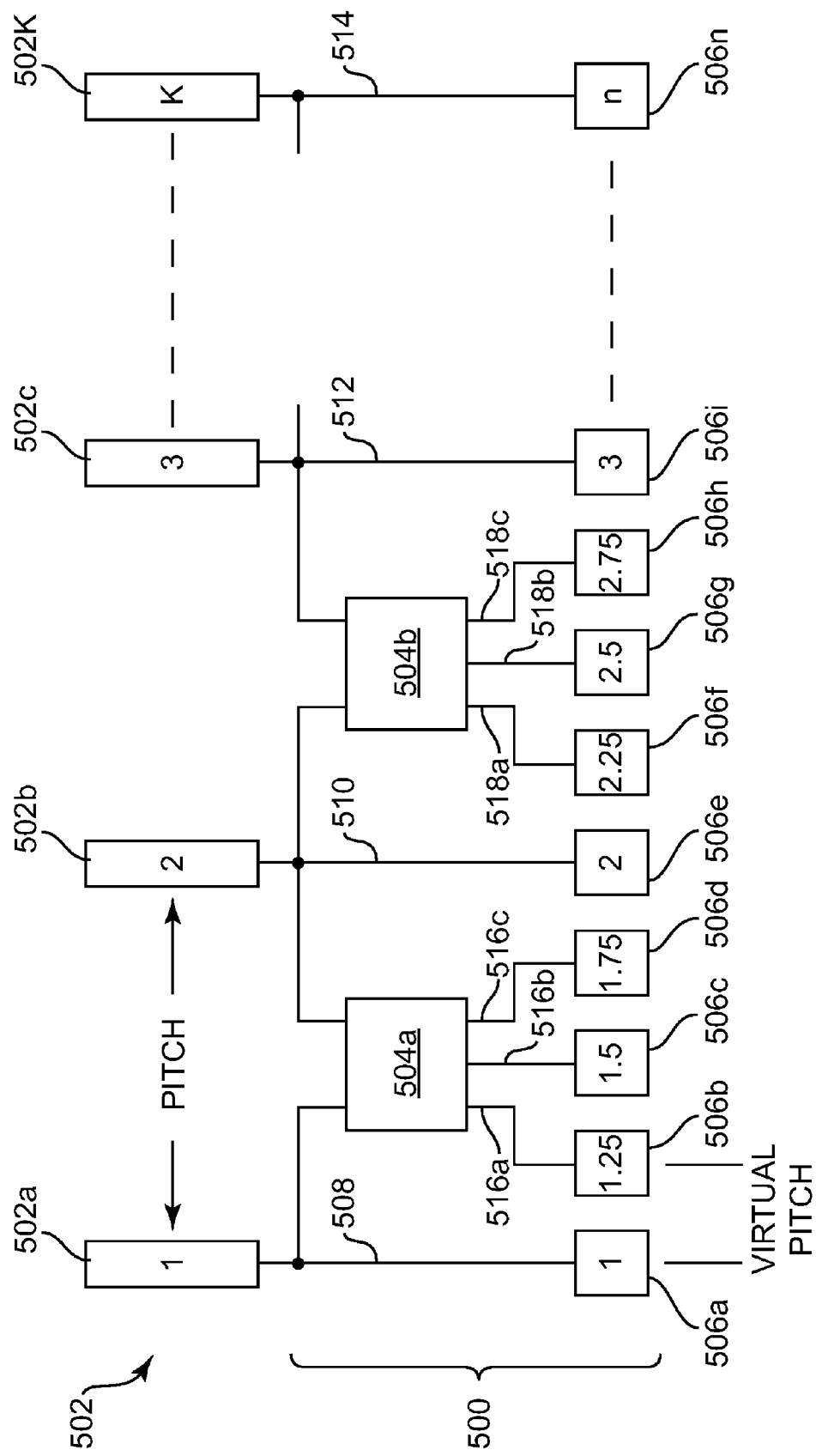
FIG. 10 is a diagram illustrating one embodiment of control logic and sensing elements.

FIG. 10 is a diagram illustrating one embodiment of control logic 500 and sensing elements 502. Control logic 500 interpolates sensed signals from sensing elements 502 to provide a smaller pitch (or smaller divisions) than the pitch between adjacent sensing elements 502. In one embodiment, control logic 500 is similar to control logic 26 and sensing elements 502 are similar to sensing elements 34 in sensor circuit 24. In one embodiment, control logic 500 is similar to control logic 108 and sensing elements 502 are similar to sensing elements 120 in sensor circuit 104. In one embodiment, control logic 500 is similar to control logic 146 and sensing elements 502 are similar to sensing elements 158 in sensor circuit 144.

Control logic 500 includes circuit blocks 504a and 504b and signal blocks 506a-506n, and sensing elements 502 include sensing elements 502a-502k. Sensing element 502a is electrically coupled to circuit block 504a and signal block 506a via signal path 508. Sensing element 502b is electrically coupled to circuit blocks 504a and 504b and to signal block 506e via signal path 510. Sensing element 502c is electrically coupled to circuit blocks 504b and 504c (not shown) and to signal block 506i via signal path 512, and so on, to sensing element 502k that is electrically coupled to signal block 506n via signal path 514. Circuit block 504a is electrically coupled to signal blocks 506b-506d via signal paths 516a-516c, respectively, and circuit block 504b is electrically coupled to signal blocks 506f-506h via signal paths 518a-518c, respectively.

Signal block 506a receives sensed signal 1 from sensing element 502a and signal block 506e receives sensed signal 2 from sensing element 502b. Circuit block 504a receives sensed signals 1 and 2 from sensing elements 502a and 502b and circuit block 504a interpolates between the received sensed signals 1 and 2 and provides virtual sensed signal 1.25 to signal block 506b, virtual sensed signal 1.5 to signal block 506c and virtual sensed signal 1.75 to signal block 506d.

Signal block 506e receives sensed signal 2 from sensing element 502b and signal block 506i receives sensed signal 3 from sensing element 502c. Circuit block 504b receives sensed signals 2 and 3 from sensing elements 502b and 502c. Circuit block 504b interpolates between the received sensed signals 2 and 3 and provides virtual sensed signal 2.25 to signal block 506f, virtual sensed signal 2.5 to signal block 506g and virtual sensed signal 2.75 to signal block 506h. This process continues up to signal block 506n receiving sensed signal k from sensing element 502k.

Control logic 500 interpolates between sensed signals from adjacent sensing elements 502 to provide a smaller pitch than the pitch between the adjacent sensing elements 502. In one embodiment, circuit blocks 504 perform weighted additions via analog circuitry that includes differential stages by adding currents to interpolate between adjacent sensing signals. In one embodiment, circuit blocks 504 perform analog to digital (A/D) conversion of the sensed signals and circuit blocks 504 include logic that interpolates digitally after A/D conversion of the sensed signals.

Figure 11:
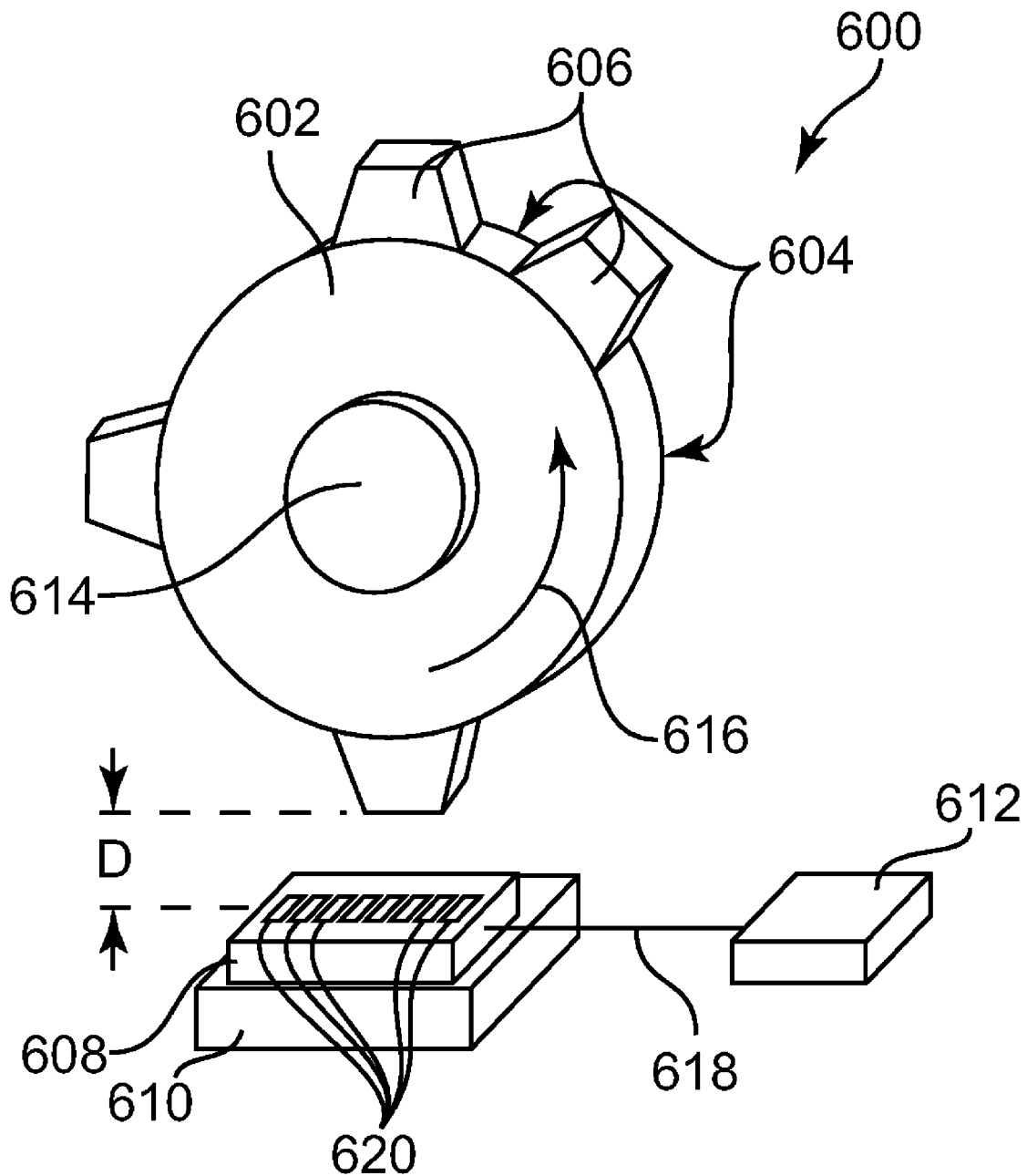
FIG. 11 is a diagram illustrating one embodiment of a sensor system including a toothed encoder wheel having space segments of different lengths between teeth segments.

FIG. 11 is a diagram illustrating one embodiment of a sensor system 600 including a toothed encoder wheel 602 having space segments 604 of different lengths between teeth segments 606. System 600 includes encoder wheel 602, sensor circuit 608, magnet 610 and control logic 612. Magnet 610 is situated under sensor circuit 608 and provides a magnetic field between encoder wheel 602 and sensor circuit 608. System 600 detects the position and motion of encoder wheel 602 via deflection of the magnetic field by encoder wheel 602. Sensor system 600 is similar to sensor system 20 and sensor system 100.

Encoder wheel 602 includes space segments 604 and teeth segments 606 and has an axis of rotation that extends out of the page at 614. Encoder wheel 602 rotates in the direction of rotation indicated at 616. Space segments 604 are between teeth segments 606 and space segments 604 are of different lengths in the direction of rotation, around the circumference of encoder wheel 602. Encoder wheel 602, including teeth segments 606, includes a ferromagnetic material that deflects the magnetic field between encoder wheel 602 and sensor circuit 608. The alternating space and teeth segments 604 and 606 produce waveforms in the signals sensed by sensor circuit 608 and control logic 612 uses one or more switching points to provide edges that correspond to crossing points in the waveforms.

Sensor circuit 608 is situated a distance D from teeth segments 606 and the outer circumference of encoder wheel 602. Also, sensor circuit 608 is electrically coupled to control logic 612 via communications path 618. In one embodiment, sensor circuit 608 and control logic 612 are part of the same semiconductor chip. In one embodiment, sensor circuit 608 and control logic 612 are on separate semiconductor chips.

Sensor circuit 608 includes multiple sensing elements 620 situated along the direction of rotation of encoder wheel 602. Each of the multiple sensing elements 620 senses the magnetic field between encoder wheel 602 and sensor circuit 608 and each of the multiple sensing elements 620 provides a sensed signal based on the sensed magnetic field. In one embodiment, sensing elements 620 include Hall effect sensing elements. In one embodiment, sensing elements 620 include XMR sensing elements. In one embodiment, sensing elements 620 include AMR sensing elements. In one embodiment, sensing elements 620 include GMR sensing elements. In one embodiment, sensing elements 620 include TMR sensing elements.

As encoder wheel 602 rotates, the rotating space and teeth segments 604 and 606 produce crossing points in the sensed signals. For example, one crossing point may be produced at each transition between a space segment 604 and one of the teeth segments 606. As a transition rotates past the multiple sensing elements 620, each of the multiple sensing elements 620 provides a crossing point or edge in its sensed signal. These crossing points or edges are shifted in time from one sensed signal to the next sensed signal by the time it takes for the transition to pass the distance between two sensing elements 620. The time differences between crossing points or edges are used to provide interpolated subtics between the last crossing point in the last sensed signal from the last sensing element 620 and the next crossing point in the first sensed signal from the first sensing element 620, which is due to the next transition in the encoder wheel 602 passing the sensing elements 620. The crossing points or edges and the interpolated subtics are used to more precisely obtain the position of the encoder wheel 602.

In this example, the multiple sensing elements 620 provide a series of edge signals in response to one transition between a space segment 604 and one of the teeth segments 606. In one embodiment, sensor circuit 608 includes at least three sensing elements 620 that provide a series of three edge signals. In one embodiment, sensor circuit 608 includes at least eight sensing elements 620 that provide a series of eight edge signals. In one embodiment, sensor circuit 608 includes at least eleven sensing elements 620 that provide a series of eleven edge signals. In one embodiment, sensing elements 620 span at least the length of one of the teeth segments 606.

Control logic 612 receives the sensed signals from the multiple sensing elements 620 via communications path 618 and processes the sensed signals to provide position and speed measurements. Control logic 612 receives each series of edge signals and provides subtics between a last edge signal in one series of edge signals and a first edge signal in the next series of edge signals. In one embodiment, control logic 612 provides subtics based on at least one measurement of the velocity of rotation of encoder wheel 602 using a series of edge signals. In one embodiment, control logic 612 provides subtics based on at least one measurement of the acceleration of rotation of encoder wheel 602 using a series of edge signals. In one embodiment, control logic 612 provides subtics based on at least one measurement of the change in the acceleration of rotation of encoder wheel 602 using a series of edge signals. In one embodiment, control logic 612 provides subtics based on a series of signals and averages of measurements, such as velocity, acceleration and the change in the acceleration of rotation of encoder wheel 602. In one embodiment, control logic 612 encodes the sensed signal edges and subtics in an output signal via a coding system, such as manchester coding or multilevel coding.

The fabrication tolerance of sensor circuit 608 is much tighter than the fabrication tolerance of space and teeth segments 604 and 606, which increases the accuracy of the subtics. Also, the workload on control logic can be reduced and the age of velocity, acceleration and change of acceleration calculations can be reduced to one series of edge signals.

Figure 12:
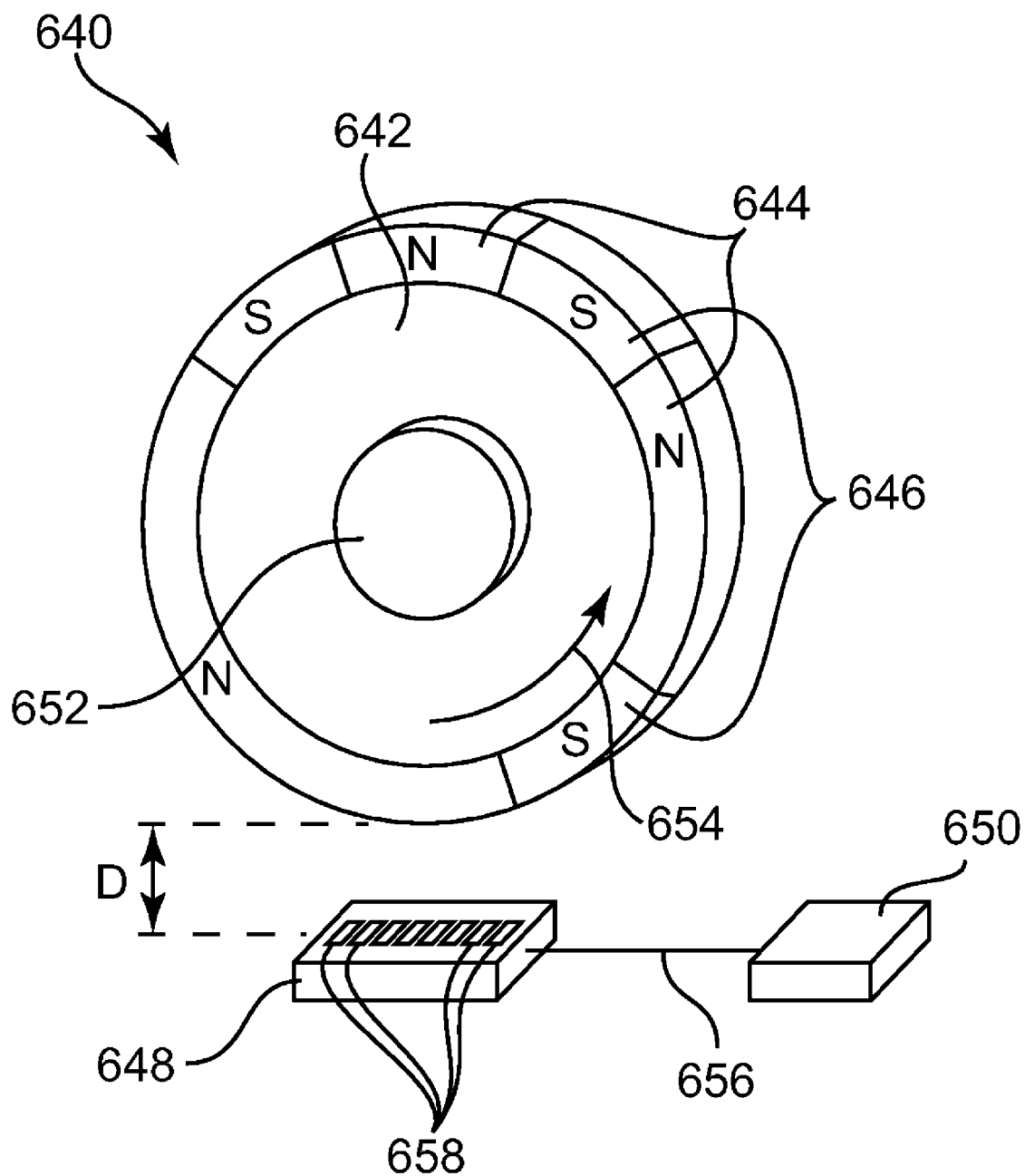
FIG. 12 is a diagram illustrating one embodiment of a sensor system including a magnetic encoder wheel having alternating north segments and south segments of different lengths.

FIG. 12 is a diagram illustrating one embodiment of a sensor system 640 including a magnetic encoder wheel 642 having alternating north segments 644 and south segments 646 of different lengths. System 640 includes encoder wheel 642, sensor circuit 648 and control logic 650. Encoder wheel 642 provides a magnetic field between encoder wheel 642 and sensor circuit 648. System 640 detects the position and motion of encoder wheel 642 via changes in the magnetic field as encoder wheel 642 rotates. Sensor system 640 is similar to sensor system 20, sensor system 140 and sensor system 600.

Encoder wheel 642 includes alternating north and south pole segments 644 and 646 and has an axis of rotation that extends out of the page at 652. Encoder wheel 642 rotates in the direction of rotation indicated at 654. North pole segments 644 and south pole segments 646 are of different lengths in the direction of rotation, around the circumference of encoder wheel 642. The alternating north and south pole segments 644 and 646 produce waveforms in signals sensed by sensor circuit 648 and control logic 650 uses one or more switching points to provide edges that correspond to crossing points in the waveforms.

Sensor circuit 648 is situated a distance D from north and south pole segments 644 and 646 and the outer circumference of encoder wheel 642. Also, sensor circuit 648 is electrically coupled to control logic 650 via communications path 656. In one embodiment, sensor circuit 648 and control logic 650 are part of the same semiconductor chip. In one embodiment, sensor circuit 648 and control logic 650 are on separate semiconductor chips.

Sensor circuit 648 includes multiple sensing elements 658 situated along the direction of rotation of encoder wheel 642. Each of the multiple sensing elements 658 senses the magnetic field between encoder wheel 642 and sensor circuit 648, and each of the multiple sensing elements 658 provides a sensed signal based on the sensed magnetic field. In one embodiment, sensing elements 658 include Hall effect sensing elements. In one embodiment, sensing elements 658 include XMR sensing elements. In one embodiment, sensing elements 658 include AMR sensing elements. In one embodiment, sensing elements 658 include GMR sensing elements. In one embodiment, sensing elements 658 include TMR sensing elements.

As encoder wheel 642 rotates, the rotating north and south pole segments 644 and 646 produce crossing points in the sensed signals. For example, one crossing point may be produced at each transition between a north pole segment 644 and a south pole segment 646. As a transition rotates past the multiple sensing elements 658, each of the multiple sensing elements 658 provides a crossing point or edge in its sensed signal. These crossing points or edges are shifted in time from one sensed signal to the next sensed signal by the time it takes for the transition to pass the distance between two sensing elements 658. The time differences between crossing points or edges are used to provide interpolated subtics between the last crossing point in the last sensed signal from the last sensing element 658 and the next crossing point in the first sensed signal from the first sensing element 658, which is due to the next transition in the encoder wheel 642 passing the sensing elements 658. The crossing points or edges and the interpolated subtics are used to more precisely obtain the position of the encoder wheel 642.

In this example, the multiple sensing elements 658 provide a series of edge signals in response to one transition between a north pole segment 644 and a south pole segment 646. In one embodiment, sensor circuit 648 includes at least three sensing elements 658 that provide a series of three edge signals. In one embodiment, sensor circuit 648 includes at least eight sensing elements 658 that provide a series of eight edge signals. In one embodiment, sensor circuit 648 includes at least eleven sensing elements 658 that provide a series of eleven edge signals.

Control logic 650 receives the sensed signals from the multiple sensing elements 658 via communications path 656 and processes the sensed signals to provide position and speed measurements. Control logic 650 receives each series of edge signals and provides subtics between a last edge signal in one series of edge signals and a first edge signal in the next series of edge signals. In one embodiment, control logic 650 provides subtics based on at least one measurement of the velocity of rotation of encoder wheel 642 using a series of edge signals. In one embodiment, control logic 650 provides subtics based on at least one measurement of the acceleration of rotation of encoder wheel 642 using a series of edge signals. In one embodiment, control logic 650 provides subtics based on at least one measurement of the change in the acceleration of rotation of encoder wheel 642 using a series of edge signals. In one embodiment, control logic 650 provides subtics based on a series of signals and averages of measurements, such as velocity, acceleration and the change in the acceleration of rotation of encoder wheel 642. In one embodiment, control logic 650 encodes the sensed signal edges and subtics in an output signal via a coding system, such as Manchester coding or multilevel coding.

The fabrication tolerance of sensor circuit 648 is much tighter than the fabrication tolerance of north and south pole segments 644 and 646, which increases the accuracy of the subtics. Also, the workload on control logic can be reduced and the age of velocity, acceleration and change of acceleration calculations can be reduced to one series of edge signals.

Figure 13:
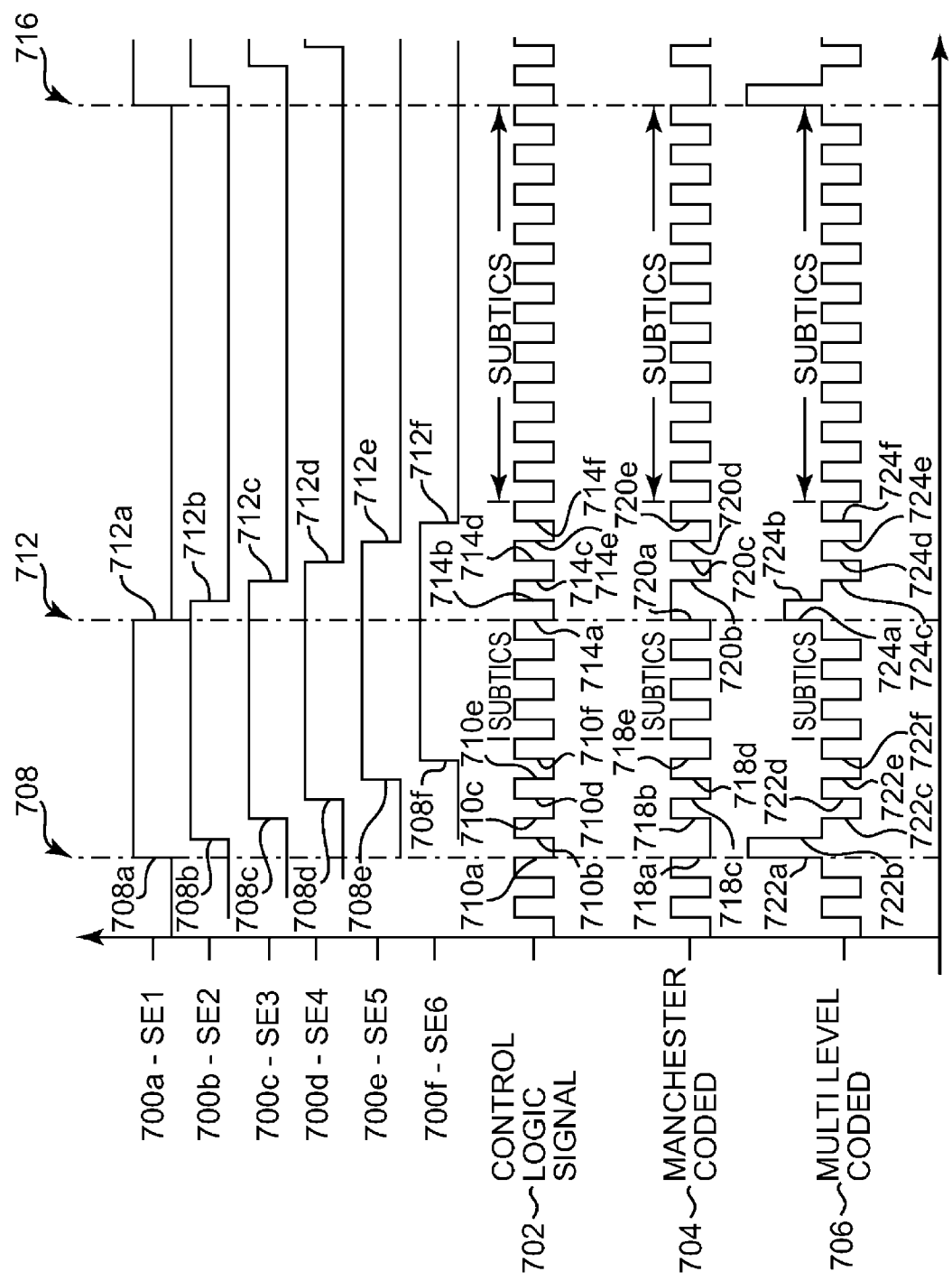
FIG. 13 is a timing diagram illustrating sensed signals, a control logic signal, a Manchester coded signal and a multi-level coded signal.

FIG. 13 is a timing diagram illustrating sensed signals SE1-SE6 at 700a-700f, respectively, a control logic signal at 702, a Manchester coded signal at 704 and a multilevel coded signal at 706. The sensed signals SE1-SE6 at 700a-700f are provided via a sensor circuit that includes six sensing elements. Each of the six sensing elements provides one of the sensed signals SE1-SE6 at 700a-700f. In one embodiment, the sensor circuit is similar to sensor circuit 24 and the sensing elements are similar to sensing elements 34. In one embodiment, the sensor circuit is similar to sensor circuit 608 and the sensing elements are similar to sensing elements 620. In one embodiment, the sensor circuit is similar to sensor circuit 648 and the sensing elements are similar to sensing elements 658.

An encoder moves or rotates to provide crossing points or edges in the sensed signals SE1-SE6 at 700a-700f. These crossing points or edges are shifted in time from one of the sensed signals SE1-SE6 at 700a-700f to the next one of the sensed signals SE1-SE6 at 700a-700f by the time it takes for a point on the encoder to move the distance between two sensing elements. The six sensing elements provide a series of six edge signals in sensed signals SE1-SE6 at 700a-700f in response to one point on the encoder, such as a transition between segments, passing the sensing elements. In one embodiment, the encoder is similar to encoder 22. In one embodiment, the encoder is similar to encoder wheel 602. In one embodiment, the encoder is similar to encoder wheel 642.

Control logic uses edges in sensed signals SE1-SE6 at 700a-700f to provide edges in signals, such as the control logic signal at 702, the Manchester coded signal 704 and the multilevel coded signal at 706. After the last edge in sensed signal SE6 at 700f and before the next edge in sensed signal SE1 at 700a, control logic provides subtics based on measurements of the time between edges in sensed signals SE1-SE6 at 700a-700f. The control logic signal at 702, the Manchester coded signal 704 and the multilevel coded signal at 706 are used to more precisely obtain the position of the encoder. In one embodiment, control logic is similar to control logic 26. In one embodiment, control logic is similar to control logic 612. In one embodiment, control logic is similar to control logic 650.

In one embodiment, control logic receives sensed signals SE1-SE6 at 700a-700f and provides the control logic signal at 702. In one embodiment, control logic encodes edges in sensed signals SE1-SE6 at 700a-700f and subtics to provide the Manchester coded signal at 704. In one embodiment, control logic encodes edges in the sensed signals SE1-SE6 at 700a-700f and subtics to provide the multilevel coded signal at 706.

Control logic measures the time between edges in sensed signals SE1-SE6 at 700a-700f to provide the interpolated subtics. In one embodiment, control logic provides subtics based on at least one measurement of the velocity of the rotation of the encoder wheel using a series of edge signals. In one embodiment, control logic provides subtics based on at least one measurement of the acceleration of the rotation of the encoder wheel using a series of edge signals. In one embodiment, control logic provides subtics based on at least one measurement of the change in the acceleration of the rotation of the encoder wheel using a series of edge signals.

In operation of one embodiment, a point on the encoder passes the six sensing elements to produce a first series of edges at 708 in sensed signals SE1-SE6 at 700a-700f. Control logic uses the first edge at 708a in sensed signal SE1 at 700a to produce a falling edge at 710a, a second edge at 708b in sensed signal SE2 at 700b to produce a rising edge at 710b, a third edge at 708c in sensed signal SE3 at 700c to produce a falling edge at 710c, a fourth edge at 708d in sensed signal SE4 at 700d to produce a rising edge at 710d, a fifth edge at 708e in sensed signal SE5 at 700e to produce a falling edge at 710e and a sixth edge at 708f in sensed signal SE6 at 700f to produce a rising edge at 710f.

After the sixth edge at 708f, control logic provides subtics based on measurements of encoder speed, such as velocity, acceleration and change in the acceleration, using the first series of edges at 708. These interpolated subtics are provided until the next point on the encoder passes the six sensing elements to produce a second series of edges at 712 in sensed signals SE1-SE6 at 700a-700f.

Then, control logic uses the first edge at 712a in sensed signal SE1 at 700a to produce a falling edge at 714a, a second edge at 712b in sensed signal SE2 at 700b to produce a rising edge at 714b, a third edge at 712c in sensed signal SE3 at 700c to produce a falling edge at 714c, a fourth edge at 712d in sensed signal SE4 at 700d to produce a rising edge at 714d, a fifth edge at 712e in sensed signal SE5 at 700e to produce a falling edge at 714e and a sixth edge at 712f in sensed signal SE6 at 700f to produce a rising edge at 714f.

After the sixth edge at 712f, control logic provides subtics based on measurements of encoder speed, such as velocity, acceleration and change in the acceleration, using the second series of edges at 712. These interpolated subtics are provided until the next point on the encoder passes the six sensing elements to produce a third series of edges at 716 in sensed signals SE1-SE6 at 700a-700f. This process continues as the encoder wheel rotates.

In one embodiment, control logic encodes edges in sensed signals SE1-SE6 at 700a-700f and subtics to provide the Manchester coded signal at 704. Control logic uses the first edge at 708a in sensed signal SE1 at 700a to produce a falling edge at 718a and a third edge at 708c in sensed signal SE3 at 700c to produce a rising edge at 718b. The long low signal between edges 718a and 718b indicates the beginning of one type of crossing point, such as a rising crossing point or a falling crossing point. Control logic uses the fourth edge at 708d in sensed signal SE4 at 700d to produce a falling edge at 718c, a fifth edge at 708e in sensed signal SE5 at 700e to produce a rising edge at 718d and a sixth edge at 708f in sensed signal SE6 at 700f to produce a falling edge at 718e.

After the sixth edge at 708f, control logic provides subtics based on measurements of encoder speed, such as velocity, acceleration and change in the acceleration, using the first series of edges at 708. These interpolated subtics are provided until the next point on the encoder passes the six sensing elements to produce a second series of edges at 712 in sensed signals SE1-SE6 at 700a-700f.

Then, control logic uses the first edge at 712a in sensed signal SE1 at 700a to produce a rising edge at 720a and a third edge at 712c in sensed signal SE3 at 700c to produce a falling edge at 720b. The long high signal between edges 720a and 720b indicates the beginning of the other type of crossing point, such as a falling crossing point or a rising crossing point. Control logic uses the fourth edge at 712d in sensed signal SE4 at 700d to produce a rising edge at 720c, a fifth edge at 712e in sensed signal SE5 at 700e to produce a falling edge at 720d and a sixth edge at 712f in sensed signal SE6 at 700f to produce a rising edge at 720e.

After the sixth edge at 712f, control logic provides subtics based on measurements of speed, such as velocity, acceleration and change in the acceleration, using the second series of edges at 712. These interpolated subtics are provided until the next point on the encoder passes the six sensing elements to produce a third series of edges at 716 in sensed signals SE1-SE6 at 700a-700f. This process continues as the encoder wheel rotates.

In one embodiment, control logic encodes edges in sensed signals SE1-SE6 at 700a-700f to provide the multilevel coded signal at 706. Control logic uses the first edge at 708a in sensed signal SE1 at 700a to produce a triple high level signal at 722a and a second edge at 708b in sensed signal SE2 at 700b to produce a falling edge that brings the signal back to a single high level at 722b. The triple high level signal between 722a and 722b indicates the beginning of one type of crossing point, such as a rising crossing point or a falling crossing point. Control logic uses a third edge at 708c in sensed signal SE3 at 700c to produce a falling edge that brings the signal to a low value at 722c. Control logic uses the fourth edge at 708d in sensed signal SE4 at 700d to produce a rising edge at 722d, a fifth edge at 708e in sensed signal SE5 at 700e to produce a falling edge at 722e and a sixth edge at 708f in sensed signal SE6 at 700f to produce a rising edge at 722f.

After the sixth edge at 708f, control logic provides subtics based on measurements of speed, such as velocity, acceleration and change in the acceleration, using the first series of edges at 708. These interpolated subtics are provided until the next point on the encoder passes the six sensing elements to produce a second series of edges at 712 in sensed signals SE1-SE6 at 700a-700f.

Then, control logic uses the first edge at 712a in sensed signal SE1 at 700a to produce a double high level signal at 724a and a second edge at 712b in sensed signal SE2 at 700b to produce a falling edge that brings the signal back to a single high level at 724b. The double high level signal between 724a and 724b indicates the beginning of the other type of crossing point, such as a falling crossing point or a rising crossing point. Control logic uses a third edge at 712c in sensed signal SE3 at 700c to produce a falling edge that brings the signal to a low value at 724c. Control logic uses the fourth edge at 712d in sensed signal SE4 at 700d to produce a rising edge at 724d, a fifth edge at 712e in sensed signal SE5 at 700e to produce a falling edge at 724e and a sixth edge at 712f in sensed signal SE6 at 700f to produce a rising edge at 724f.

After the sixth edge at 712f, control logic provides subtics based on measurements of speed, such as velocity, acceleration and change in the acceleration, using the second series of edges at 712. These interpolated subtics are provided until the next point on the encoder passes the six sensing elements to produce a third series of edges at 716 in sensed signals SE1-SE6 at 700a-700f. This process continues as the encoder wheel rotates.

In one embodiment, control logic provides subtics based on one or more series of edge signals and averages of measurements, such as velocity, acceleration and the change in the acceleration of movement of the encoder.

Figure 14:
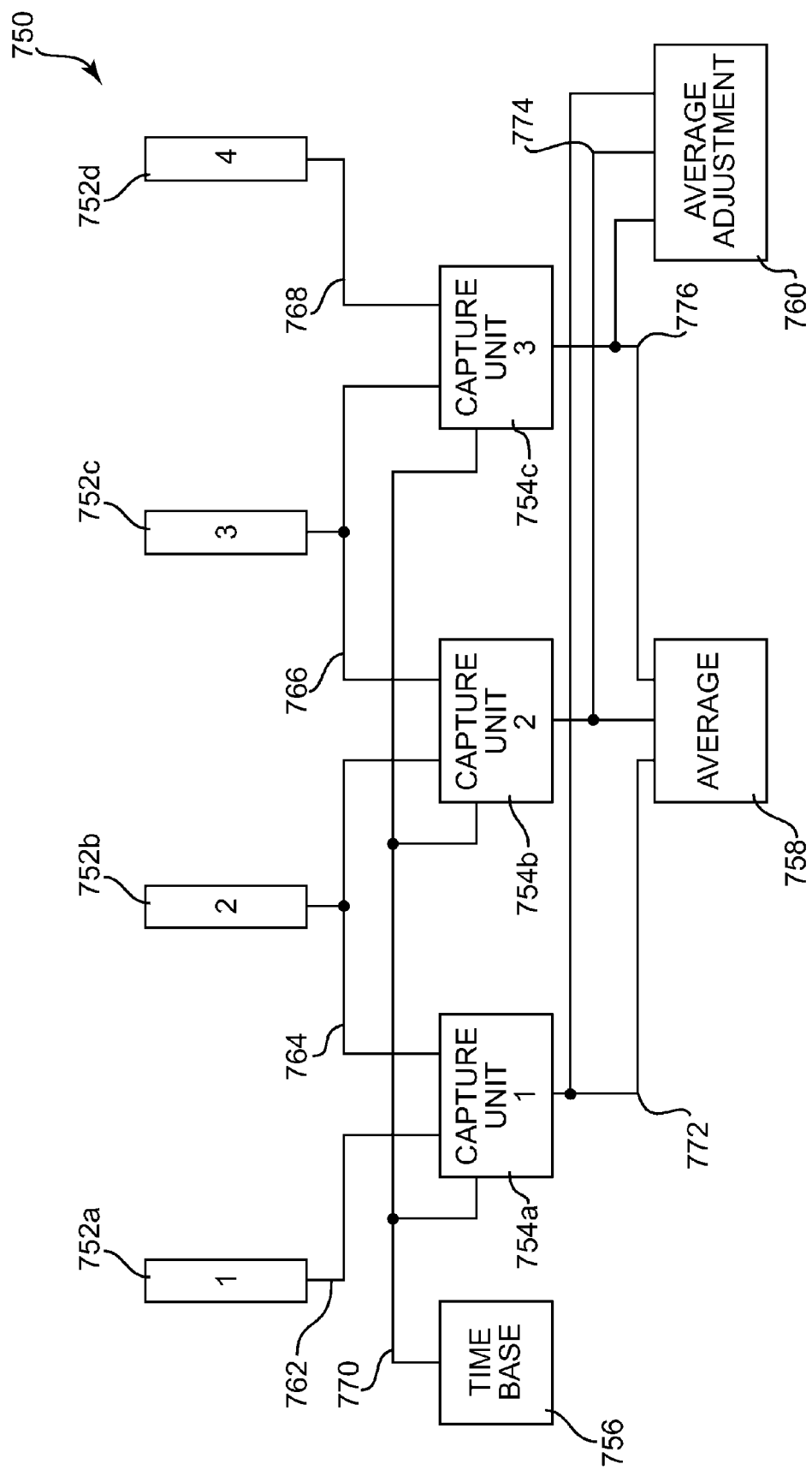
FIG. 14 is a diagram illustrating one embodiment of a sensor system that provides subtics.

FIG. 14 is a diagram illustrating one embodiment of a sensor system 750 that provides subtics based on an average velocity measurement of the encoder. System 750 includes four sensor elements 752a-752d, three capture units 754a-754c, a time base 756, an averaging block 758 and an average adjustment block 760. System 750 calculates the average length of time between edges in sensed signals from adjacent sensor elements 752a-752d and provides subtics based on this average value. System 750 also calculates acceleration and change in acceleration adjustments for the average value to provide the subtics.

Sensor elements 752a-752d are electrically coupled to capture units 754a-754c. Sensor element 1 at 752a is electrically coupled to capture unit 1 at 754a via sensed signal path 762. Sensor element 2 at 752b is electrically coupled to capture unit 1 at 754a and capture unit 2 at 754b via sensed signal path 764. Sensor element 3 at 752c is electrically coupled to capture unit 2 at 754b and to capture unit 3 at 754c via sensed signal path 766. Sensor element 4 at 752d is electrically coupled to capture unit 3 at 754c via sensed signal path 768.

Each of the capture units 754a-754c is electrically coupled to time base 756 via time base path 770. Also, capture unit 1 at 754a is electrically coupled to averaging block 758 and to average adjustment block 760 via time difference path 772, capture unit 2 at 754b is electrically coupled to averaging block 758 and to average adjustment block 760 via time difference path 774 and capture unit 3 at 754c is electrically coupled to averaging block 758 and to average adjustment block 760 via time difference path 776.

Each of the sensing elements 752a-752d provides crossing points or edges in its sensed signal. Capture unit 1 at 754a receives the sensed signals from sensing element 1 at 752a and sensing element 2 at 752b and captures the time difference between edges from sensor element 1 at 752a and sensor element 2 at 752b. Capture unit 2 at 754b receives the sensed signals from sensing element 2 at 752b and sensing element 3 at 752c and captures the time difference between edges from sensor element 2 at 752b and sensor element 3 at 752c. Capture unit 3 at 754c receives the sensed signals from sensing element 3 at 752c and sensing element 4 at 752d and captures the time difference between edges from sensor element 3 at 752c and sensor element 4 at 752d. In one embodiment, capture units 754a-754c include counters that receive a clock signal from time base 756 to capture time differences between edges.

Averaging block 758 receives the captured time difference measurement from each of the capture units 754a-754c and calculates an average time difference value. Control logic uses this average time difference value to provide subtics. Also, average adjustment block 760 receives the captured time difference measurements from each of the capture units 754a-754c and calculates acceleration and change in acceleration values. Control logic adjusts the subtics based on these acceleration and change in acceleration values.

Averaging the measurement reduces the influence of fabrication tolerances. Also, averaging the measurement reduces resolution and jitter requirements.

FIGS. 15-23 are diagrams illustrating embodiments of sensor systems and circuits. Some embodiments of sensing elements are GMR sensing elements that are sensitive to magnetic fields in the tangential direction of the encoder wheel, i.e. tangential to the encoder wheel. Some embodiments of sensing elements are GMR sensing elements that are sensitive to magnetic fields in the radial direction of the encoder wheel, i.e. extending from the center of the encoder wheel. Other embodiments of sensing elements are GMR sensing elements that are sensitive to magnetic fields in another direction, lying in the die surface of the sensing element. In other embodiments, the sensing elements are other suitable sensing elements, such as XMR sensing elements including AMR sensing elements and/or TMR sensing elements.

Figure 15:
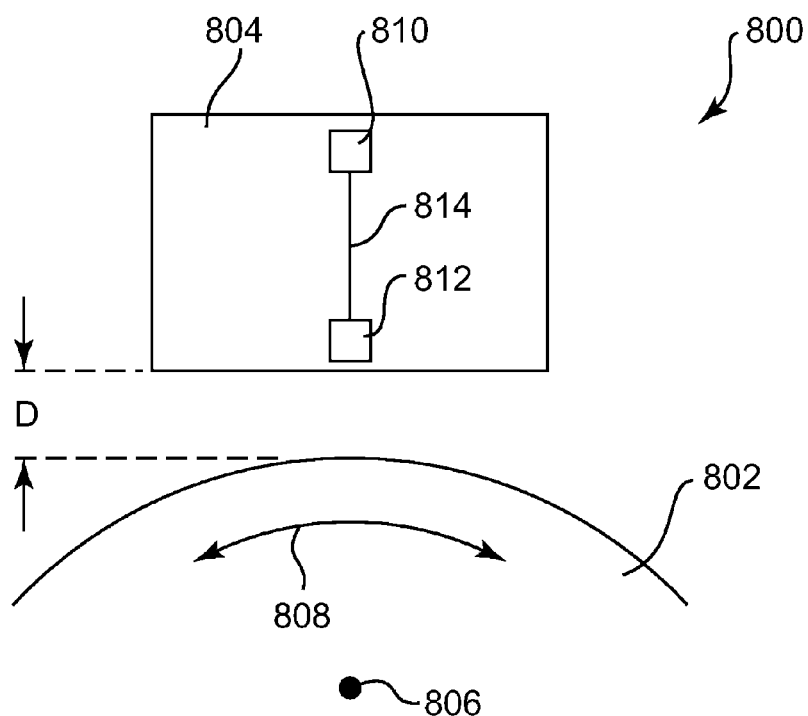
FIG. 15 is a diagram illustrating one embodiment of a sensor system that operates with larger air-gaps or distances between the encoder wheel and the sensor circuit.

FIG. 15 is a diagram illustrating one embodiment of a sensor system 800 that operates with larger air-gaps or distances D between encoder wheel 802 and sensor circuit 804. Encoder wheel 802 includes an axis of rotation at 806 that extends out of the page and encoder wheel 802 rotates in the direction(s) indicated at 808. In one embodiment, sensor system 800 is similar to sensor system 20. In one embodiment, encoder wheel 802 is similar to a toothed encoder wheel, which has encoder segments that are alternating teeth and space segments. In one embodiment, encoder wheel 802 is similar to a magnetic encoder wheel, which has encoder segments that are alternating north and south poles.

Sensor circuit 804 includes a first sensing element 810 and a second sensing element 812. First sensing element 810 is electrically coupled to second sensing element 812 via conductive path 814. First sensing element 810 is situated along a radius from the axis of rotation at 806 and second sensing element 812 is situated along a radius from the axis of rotation at 806. Sensor circuit 804 is situated in an upright position, such that first sensing element 810 is radially further away from the axis of rotation at 806 than second sensing element 812. In one embodiment, first sensing element 810 and second sensing element 812 are on the same radius from the axis of rotation at 806. In one embodiment, first sensing element 810 is along a different radius than second sensing element 812 from the axis of rotation at 806.

In operation, encoder wheel 802 rotates to change the magnetic field between encoder wheel 802 and sensor circuit 804. The magnetic field is sensed via the top or first sensing element 810 and the bottom or second sensing element 812. Since first sensing element 810 is further away from encoder wheel 802, the detected magnetic field is smaller at first sensing element 810 than at second sensing element 812. Thus, the resistance through first sensing element 810 does not change or changes little in comparison to the resistance through second sensing element 812 as encoder wheel 802 rotates. Sensor system 800 is not dependent on pole pitch, i.e. works for substantially any pole pitch, such as arbitrarily large pole pitches and large air-gaps or distances D. In one embodiment, first sensing element 810 and second sensing element 812 are part of a quarter bridge comparator circuit for detecting changes in the magnetic field between encoder wheel 802 and sensor circuit 804.

Figure 16:
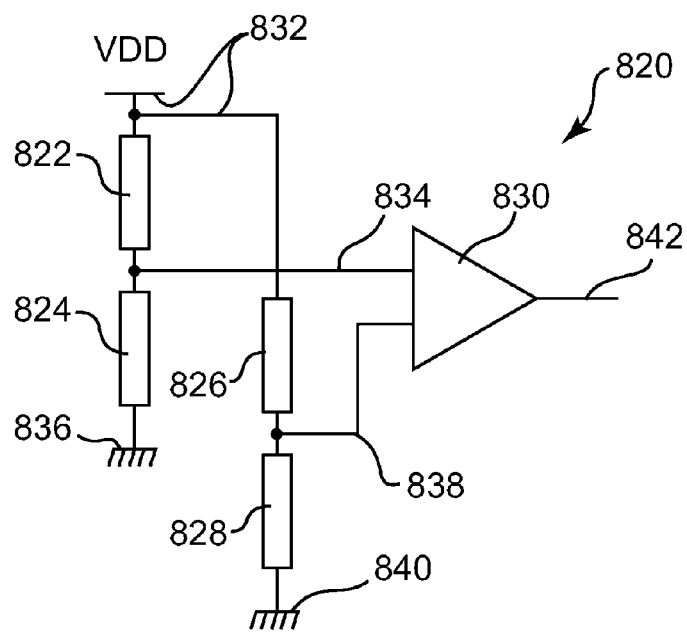
FIG. 16 is a diagram illustrating one embodiment of a comparator circuit.

FIG. 16 is a diagram illustrating one embodiment of a comparator circuit 820. Comparator circuit 820 includes a first resistor 822, a second resistor 824, a third resistor 826, a fourth resistor 828 and a comparator 830. First resistor 822 is the top or first sensing element 810 and second resistor 824 is the bottom or second sensing element 812. Third and fourth resistors 826 and 828 are reference resistors.

One side of first resistor 822 is electrically coupled to VDD at 832 and the other side of first resistor 822 is electrically coupled to one side of second resistor 824 and one input of comparator 830 via input path 834. The other side of second resistor 824 is electrically coupled to a reference, such as ground at 836. One side of third resistor 826 is electrically coupled to VDD at 832 and the other side of third resistor 826 is electrically coupled to one side of fourth resistor 828 and the other input of comparator 830 via input path 838. The other side of fourth resistor 828 is electrically coupled to a reference, such as ground, at 840. The third and fourth resistors 828 and 830 provide a reference voltage at 838 to the other input of comparator 830.

In operation, encoder wheel 802 rotates to change the magnetic field between encoder wheel 802 and sensor circuit 804. This magnetic field is sensed via first sensing element 810 and second sensing element 812 and the resistance through first sensing element 810 or first resistor 822 does not change or changes little in comparison to the resistance through second sensing element 812 or second resistor 824. At 834, the voltage at the first input of comparator 830 oscillates around the reference voltage at 838 and comparator 830 provides a corresponding output signal at 842.

Figure 17:
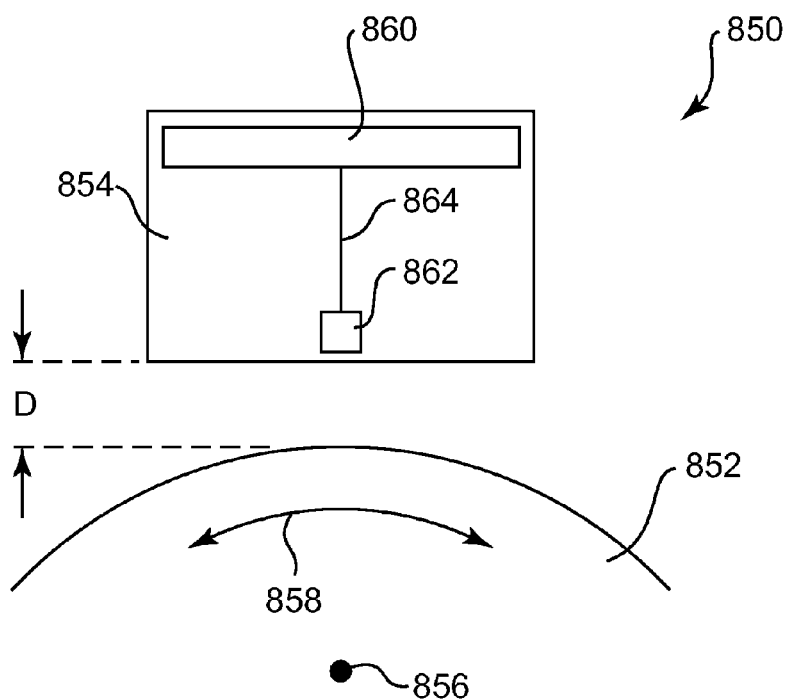
FIG. 17 is a diagram illustrating one embodiment of a sensor system that reduces saturation of at least one sensing element with small air-gaps or distances between the encoder wheel and the sensor circuit.

FIG. 17 is a diagram illustrating one embodiment of a sensor system 850 that reduces saturation of at least one sensing element with small air-gaps or distances D between encoder wheel 852 and sensor circuit 854. Encoder wheel 852 includes an axis of rotation at 856 that extends out of the page and encoder wheel 852 rotates in the direction(s) indicated at 858. In one embodiment, sensor system 850 is similar to sensor system 20. In one embodiment, encoder wheel 852 is similar to a toothed encoder wheel, which has encoder segments that are alternating teeth and space segments. In one embodiment, encoder wheel 852 is similar to a magnetic encoder wheel, which has encoder segments that are alternating north and south poles.

Sensor circuit 854 includes a first sensing element 860 and a second sensing element 862 that is electrically coupled to first sensing element 860 via conductive path 864. First sensing element 860 is an elongated rectangle that extends across the top of sensor circuit 854 and is situated along a radius from the axis of rotation at 856. Second sensing element 862 is situated at the bottom of sensor circuit 854 and along a radius from the axis of rotation at 856. Sensor circuit 854 is situated in an upright position, such that first sensing element 860 is radially further away from the axis of rotation at 856 than second sensing element 862. The rectangular shapes of first and second sensing elements 860 and 862 denote the area of the sensing elements. In one embodiment, at least one of the first and second sensing elements 860 and 862 is a single strip. In one embodiment, at least one of the first and second sensing elements 860 and 862 is a meandering strip.

In operation, encoder wheel 852 rotates to change the magnetic field between encoder wheel 852 and sensor circuit 854. The magnetic field is sensed via the top or first sensing element 860 and the bottom or second sensing element 862. Since first sensing element 860 is further away from encoder wheel 852, the detected magnetic field is smaller at first sensing element 860 than at second sensing element 862. Also, first sensing element 860 smears or spreads out the magnetic field, which reduces saturation of first sensing element 860 with small air-gaps or distances D and/or larger pole pitch encoder wheels.

As encoder wheel 852 rotates, second sensing element 862 is closer to encoder wheel 852 than first sensing element 860 and second sensing element 862 always experiences larger field excursions than first sensing element 860. If the air-gap or distance D is small and the magnetic field is strong, second sensing element 862 is driven into saturation, while first sensing element 860 is not entirely driven into saturation because it spreads out the magnetic field to the left and right, where the field diminishes, and because it is further away from the encoder wheel 852. In one embodiment where first and second sensing elements 860 and 862 are GMR sensors, if a magnetic pole is exactly below second sensing element 862 and drives second sensing element 862 into positive saturation, the resistance of second sensing element 862 is at least slightly larger than the resistance of first sensing element 860.

Sensor system 850 is not dependent on pole pitch, i.e. works for substantially any pole pitch, and reduces saturation of sensing elements with arbitrarily large poles and/or smaller air-gaps or distances D. In one embodiment, first sensing element 860 and second sensing element 862 are part of a quarter bridge comparator circuit for detecting changes in the magnetic field between encoder wheel 852 and sensor circuit 854. In one embodiment, first sensing element 860 and second sensing element 862 are part of a comparator circuit similar to comparator circuit 820.

Figure 18:
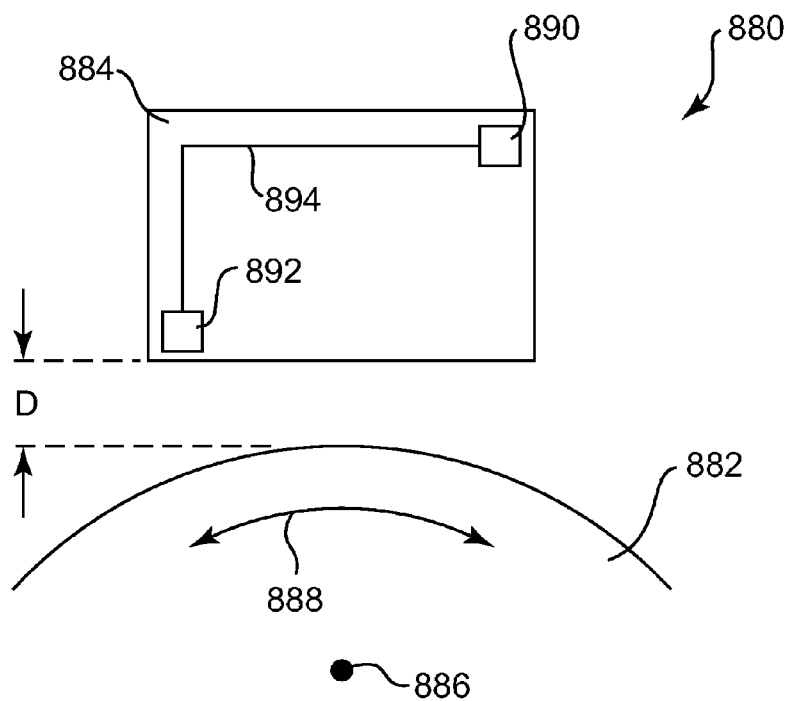
FIG. 18 is a diagram illustrating one embodiment of a sensor system that reduces saturation of at least one sensing element via spreading out first and second sensing elements.

FIG. 18 is a diagram illustrating one embodiment of a sensor system 880 that reduces saturation of at least one sensing element via spreading out first and second sensing elements 890 and 892. Sensor system 880 functions with large and small air-gaps or distances D between encoder wheel 882 and sensor circuit 884.

Encoder wheel 882 includes an axis of rotation at 886 that extends out of the page and encoder wheel 882 rotates in the direction(s) indicated at 888. In one embodiment, sensor system 880 is similar to sensor system 20. In one embodiment, encoder wheel 882 is similar to a toothed encoder wheel, which has encoder segments that are alternating teeth and space segments. In one embodiment, encoder wheel 882 is similar to a magnetic encoder wheel, which has encoder segments that are alternating north and south poles.

Sensor circuit 884 includes a first sensing element 890 and a second sensing element 892 that is electrically coupled to first sensing element 890 via conductive path 894. First sensing element 890 is situated in the top, right corner of sensor circuit 884 and along a radius from the axis of rotation at 886. Second sensing element 892 is situated in the bottom, left corner and along a radius from the axis of rotation at 886. Sensor circuit 884 is situated in an upright position, such that first sensing element 890 is radially further away from the axis of rotation at 886 than second sensing element 892. The rectangular shapes of first and second sensing elements 890 and 892 denote the area of the sensing elements. In one embodiment, at least one of the first and second sensing elements 890 and 892 is a single strip. In one embodiment, at least one of the first and second sensing elements 890 and 892 is a meandering strip.

In operation, encoder wheel 882 rotates to change the magnetic field between encoder wheel 882 and sensor circuit 884. The magnetic field is sensed via the top or first sensing element 890 and the bottom or second sensing element 892.

With a large air-gap or distance D, first sensing element 890 is further away from encoder wheel 882 and the detected magnetic field is smaller at first sensing element 890 than at second sensing element 892. Also, the resistance through first sensing element 890 does not change or changes little and the resistance through second sensing element 892 changes more as encoder wheel 882 rotates. In this situation, sensor circuit 884 switches as a switching point, such as a segment transition, on the encoder wheel passes under second sensing element 892.

With a small air-gap or distance D, first sensing element 890 is on the other side of sensor circuit 884 and the detected magnetic field is negative at first sensing element 890 as compared to the detected magnetic field at second sensing element 892. As encoder wheel 882 rotates, it causes second sensing element 892 to change alternately between positive and negative saturation, while first sensing element 890 is not driven so deeply into saturation due to being further away from encoder wheel 882. In this situation, sensor circuit 884 switches as a switching point, such as a segment transition, on the encoder wheel passes under the center between first sensing element 890 and second sensing element 892. Thus, position detection depends on the air-gap or distance D.

In one embodiment, sensor circuit 880 includes two more sensing elements, with one sensing element in each of the other two corners of sensor circuit 884. In one embodiment, first sensing element 890 and second sensing element 892 are part of a quarter bridge comparator circuit for detecting changes in the magnetic field between encoder wheel 882 and sensor circuit 884. In one embodiment, first sensing element 890 and second sensing element 892 are part of a comparator circuit similar to comparator circuit 820.

Figure 19:
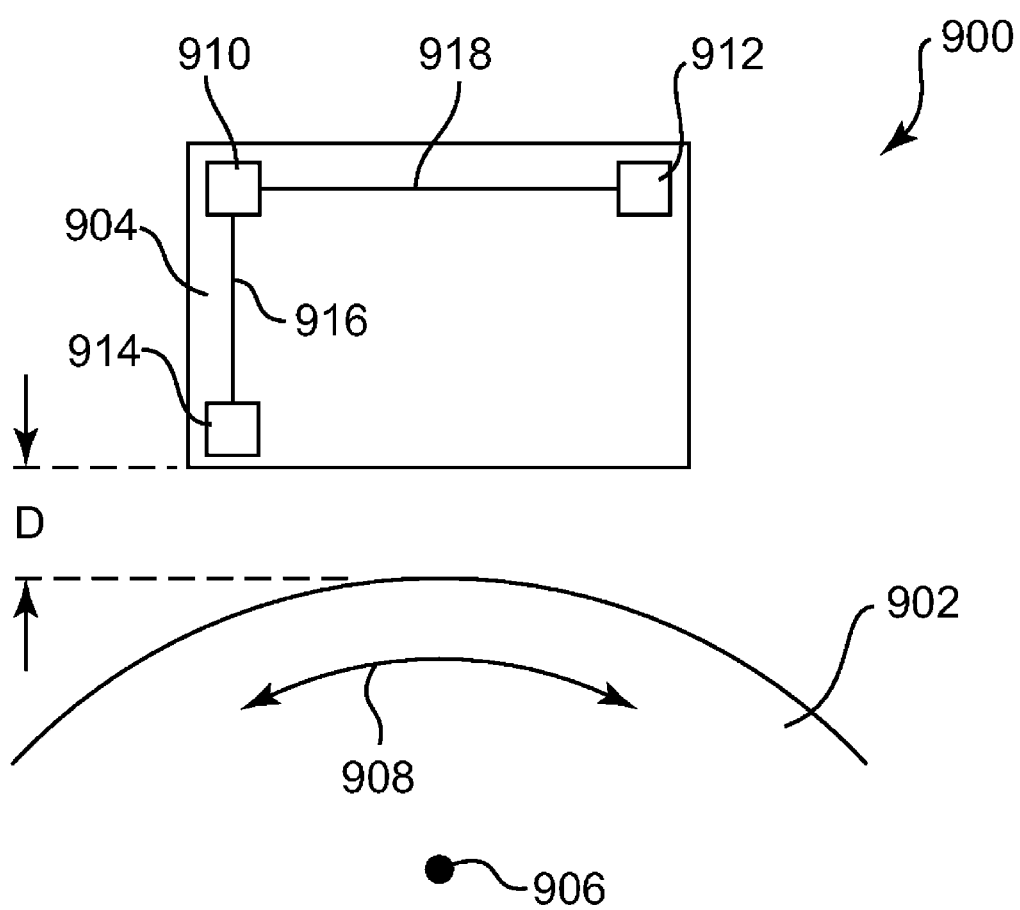
FIG. 19 is a diagram illustrating one embodiment of a sensor system that includes three sensing elements.

FIG. 19 is a diagram illustrating one embodiment of a sensor system 900 that includes three sensing elements. Sensor system 900 functions with large and small air-gaps or distances D between encoder wheel 902 and sensor circuit 904.

Encoder wheel 902 includes an axis of rotation at 906 that extends out of the page and encoder wheel 902 rotates in the direction(s) indicated at 908. In one embodiment, sensor system 900 is similar to sensor system 20. In one embodiment, encoder wheel 902 is similar to a toothed encoder wheel, which has encoder segments that are alternating teeth and space segments. In one embodiment, encoder wheel 902 is similar to a magnetic encoder wheel, which has encoder segments that are alternating north and south poles.

Sensor circuit 904 includes a first sensing element 910, a second sensing element 912 and a third sensing element 914. First sensing element 910 is electrically coupled to second sensing element 912 via conductive path 916 and second sensing element 912 is electrically coupled to third sensing element 914 via conductive path 918. First sensing element 910 is situated in the top, left corner of sensor circuit 904 and along a radius from the axis of rotation at 906. Second sensing element 912 is situated in the top, right corner of sensor circuit 904 and along a radius from the axis of rotation at 906, and third sensing element 914 is situated in the bottom, left corner and along a radius from the axis of rotation at 906. Sensor circuit 904 is situated in an upright position, such that first sensing element 910 and second sensing element 912 are radially further away from the axis of rotation at 906 than third sensing element 914. The rectangular shapes of first, second and third sensing elements 910, 912 and 914 denote the area of the sensing elements. In one embodiment, at least one of the first, second and third sensing elements 910, 912 and 914 is a single strip. In one embodiment, at least one of the first, second and third sensing elements 910, 912 and 914 is a meandering strip.

In operation, encoder wheel 902 rotates to change the magnetic field between encoder wheel 902 and sensor circuit 904. The magnetic field is sensed via first sensing element 910, second sensing element 912 and third sensing element 914.

With a large air-gap or distance D, first and second sensing elements 910 and 912 are further away from encoder wheel 902 and the detected magnetic field is smaller at first and second sensing elements 910 and 912 than at third sensing element 914. The resistance through first and second sensing elements 910 and 912 do not change or change little and the resistance through third sensing element 914 changes more as encoder wheel 902 rotates. In this situation, sensor circuit 904 switches as a switching point, such as a segment transition, on the encoder wheel passes under third sensing element 912.

With a small air-gap or distance D, first sensing element 910 is on one side of sensor circuit 904 and second sensing element 912 is on the other side of sensor circuit 904, such that together, first and second sensing elements 910 and 912 provide an averaged response to the detected magnetic field. The detected magnetic field at third sensing element 914 is different than the averaged magnetic field, such that the resistance through first and second sensing element 910 and 912 changes differently than the resistance through third sensing element 914 as encoder wheel 902 rotates. In this situation, sensor circuit 904 switches as a switching point, such as a segment transition, on the encoder wheel passes under a point between second sensing element 912 and third sensing element 914.

In one embodiment, first sensing element 910, second sensing element 912 and third sensing element 914 are part of a quarter bridge comparator circuit for detecting changes in the magnetic field between encoder wheel 902 and sensor circuit 904. In one embodiment, first sensing element 910, second sensing element 912 and third sensing element 914 are part of a comparator circuit similar to comparator circuit 820.

Figure 20:
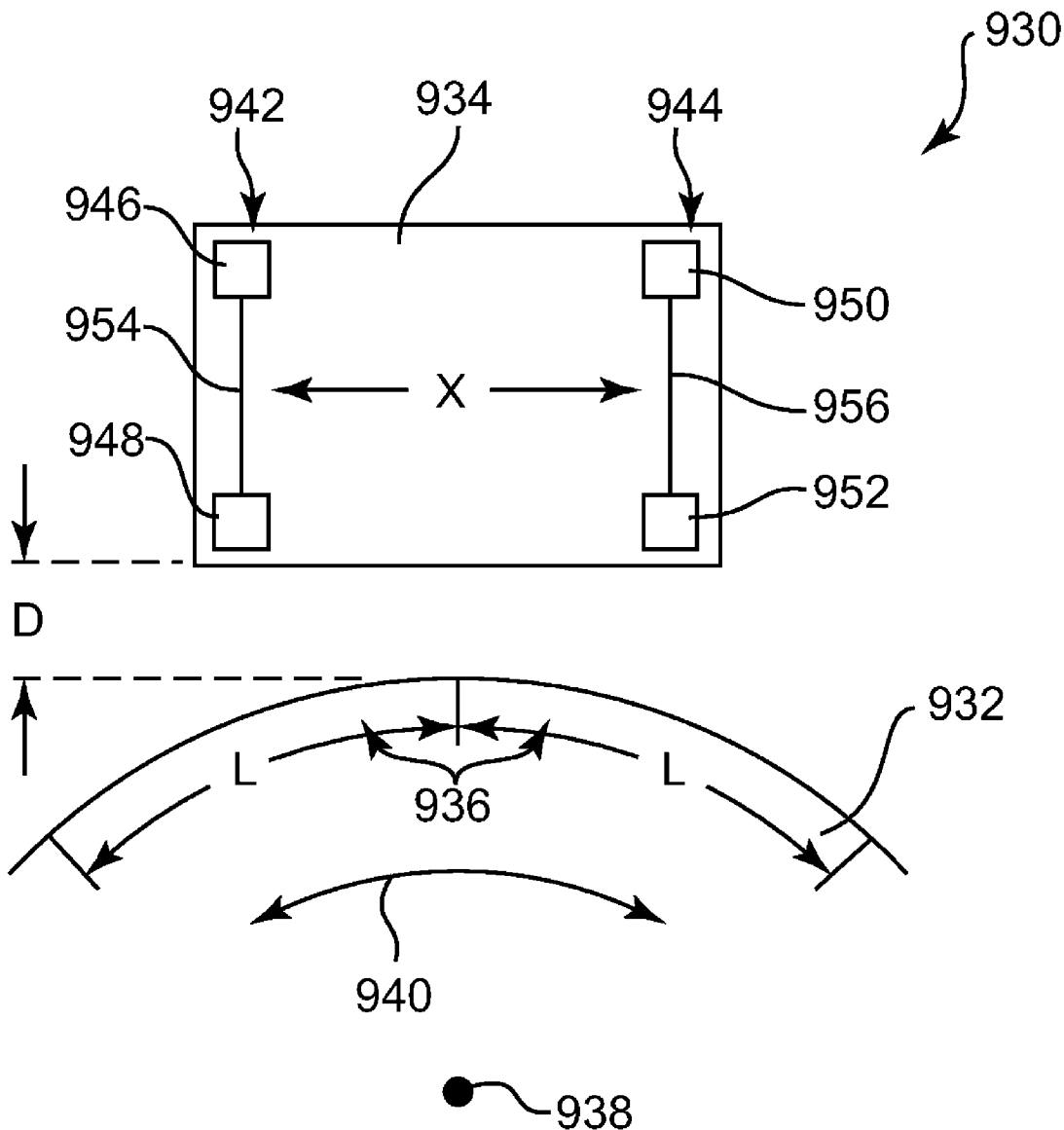
FIG. 20 is a diagram illustrating one embodiment of a sensor system that doubles the angular resolution of an encoder wheel.

FIG. 20 is a diagram illustrating one embodiment of a sensor system 930 that doubles the angular resolution of an encoder wheel 932. Sensor system 930 includes encoder wheel 932 and a sensor circuit 934 situated a distance D from encoder wheel 932. In one embodiment, sensor system 930 is similar to sensor system 20.

Encoder wheel 932 includes encoder segments 936 that provide or influence the magnetic field sensed by sensor circuit 934. Encoder wheel 932 includes an axis of rotation at 938 that extends out of the page and encoder wheel 932 rotates in the direction(s) indicated at 940. Each of the encoder segments 936 has the same length L in the direction of rotation, around the circumference of encoder wheel 932 and the pole-pitch of encoder wheel 932 is equal to two times the length L. Encoder wheel 932 rotates in relation to sensor circuit 934, which changes the magnetic field between encoder wheel 932 and sensor circuit 934. In one embodiment, encoder wheel 932 is a toothed encoder wheel and each of the encoder segments 936 is a tooth or a space between teeth. In one embodiment, encoder wheel 932 is a magnetic encoder wheel and each of the encoder segments 936 is a magnetic north pole or a magnetic south pole. In other embodiments, at least some of the encoder segments 936 have different lengths in the direction of rotation, around the circumference of encoder wheel 932.

Sensor circuit 934 includes two pair of sensing elements 942 and 944 separated a distance X. The first pair of sensing elements 942 includes a first top sensing element 946 and a first bottom sensing element 948. The second pair of sensing elements 944 includes a second top sensing element 950 and a second bottom sensing element 952. First top sensing element 946 is electrically coupled to first bottom sensing element 948 via conductive path 954 and second top sensing element 950 is electrically coupled to second bottom sensing element 952 via conductive path 956. The two pairs of sensing elements 942 and 944 are separated a distance X that is one fourth the pole-pitch, i.e. one half the length L of one of the encoder segments 936.

First top sensing element 946 is situated in the top, left corner of sensor circuit 934 and first bottom sensing element 948 is situated in the bottom, left corner of sensor circuit 934. Second top sensing element 950 is situated in the top, right corner of sensor circuit 934 and second bottom sensing element 952 is situated in the bottom, right corner of sensor circuit 934. Each of the sensing elements 946, 948, 950 and 952 is situated along a radius from the axis of rotation at 938. Sensor circuit 934 is situated in an upright position, such that first top sensing element 946 is radially further away from the axis of rotation at 938 than first bottom sensing element 948, and second top sensing element 950 is radially further away from the axis of rotation at 938 than second bottom sensing element 952. The rectangular shapes of the sensing elements 946, 948, 950 and 952 denote the area of the sensing elements. In one embodiment, at least one of the sensing elements 946, 948, 950 and 952 is a single strip. In one embodiment, at least one of the sensing elements 946, 948, 950 and 952 is a meandering strip.

In operation, encoder wheel 932 rotates to change the magnetic field between encoder wheel 932 and sensor circuit 934. The magnetic field is sensed via the first pair of sensing elements 942 and the second pair of sensing elements 944, which are separated the distance X that is one fourth the pole-pitch, i.e. one half the length L of one of the encoder segments 936. Each time a crossing point, such as a transition, on encoder wheel 932 passes under one of the pairs of sensing elements 942 and 944 to provide a zero or cross-over, the other pair of sensing elements 942 and 944 senses a minimum or a maximum. This effectively doubles the angular resolution of encoder wheel 932 as compared to the angular resolution in a system that uses encoder wheel 932 and a sensor circuit with only one sensing element or one sensing element pair.

In other embodiments, sensor circuit 934 can be used with an encoder wheel having twice the pole pitch of encoder wheel 932 to attain the same angular resolution obtained via one sensing element or one sensing element pair and encoder wheel 932. In a system having twice the pole pitch of encoder wheel 932, the air-gap or distance D can be increased between the encoder wheel and sensor circuit 934.

In one embodiment, the first pair of sensing elements 942 is part of a quarter bridge comparator circuit for detecting changes in the magnetic field between encoder wheel 932 and sensor circuit 934 and the second pair of sensing elements 944 is part of a quarter bridge comparator circuit for detecting changes in the magnetic field between encoder wheel 932 and sensor circuit 934. In one embodiment, the first pair of sensing elements 942 is part of a comparator circuit similar to comparator circuit 820. In one embodiment, the second pair of sensing elements 944 is part of a comparator circuit similar to comparator circuit 820.

Figure 21:
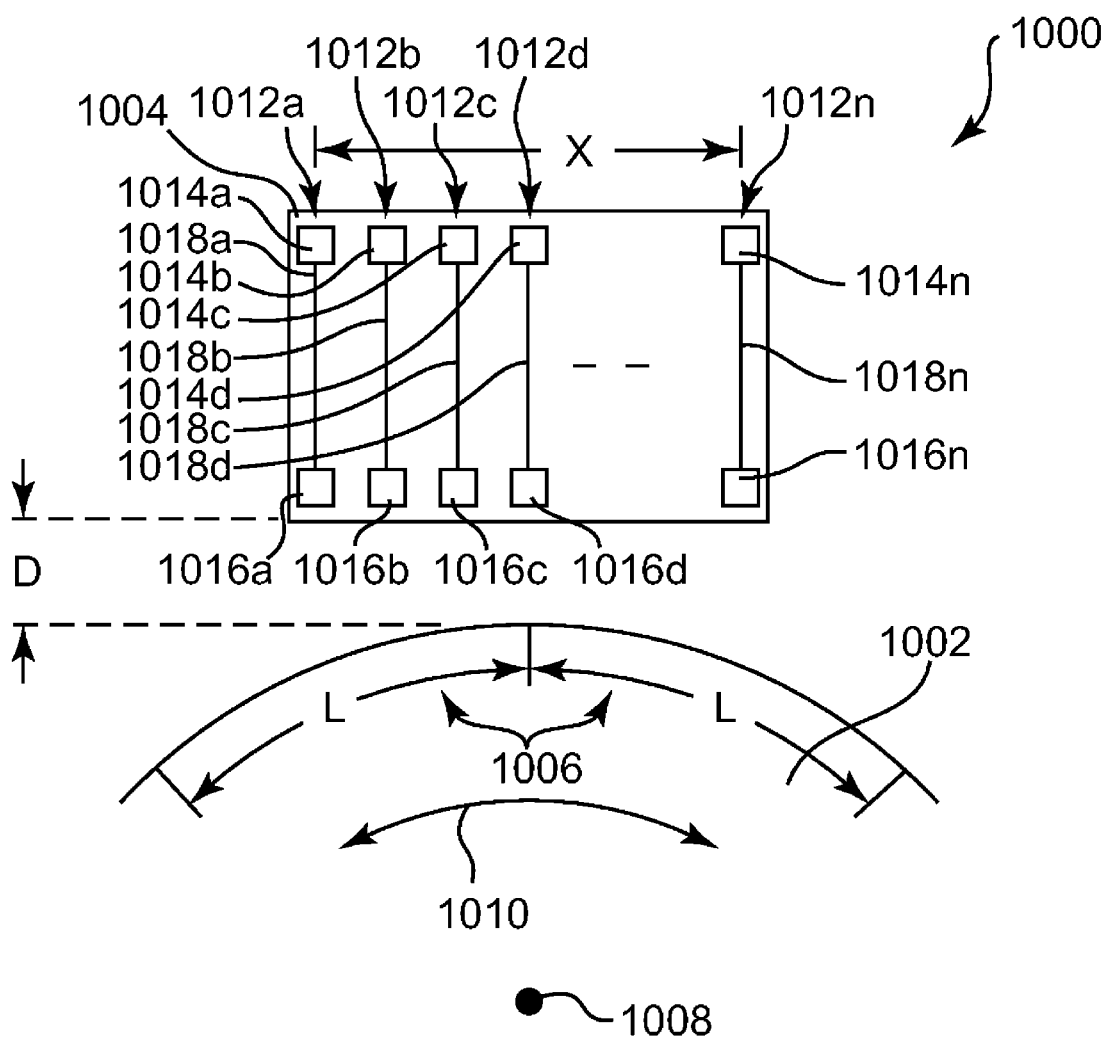
FIG. 21 is a diagram illustrating one embodiment of a sensor system that provides finer improved angular resolution.

FIG. 21 is a diagram illustrating one embodiment of a sensor system 1000 that provides improved angular resolution. Sensor system 1000 includes an encoder wheel 1002 and a sensor circuit 1004 situated a distance D from encoder wheel 1002. In one embodiment, sensor system 1000 is similar to sensor system 20.

Encoder wheel 1002 includes encoder segments 1006 that provide or influence the magnetic field sensed by sensor circuit 1004. Encoder wheel 1002 includes an axis of rotation at 1008 that extends out of the page and encoder wheel 1002 rotates in the direction(s) indicated at 1010. Each of the encoder segments 1006 has the same length L in the direction of rotation, around the circumference of encoder wheel 1002 and the pole-pitch of encoder wheel 1002 is equal to two times the length L. Encoder wheel 1002 rotates in relation to sensor circuit 1004, which changes the magnetic field between encoder wheel 1002 and sensor circuit 1004. In one embodiment, encoder wheel 1002 is a toothed encoder wheel and each of the encoder segments 1006 is a tooth or a space between teeth. In one embodiment, encoder wheel 1002 is a magnetic encoder wheel and each of the encoder segments 1006 is a magnetic north pole or a magnetic south pole. In other embodiments, at least some of the encoder segments 1006 have different lengths in the direction of rotation, around the circumference of encoder wheel 1002.

Sensor circuit 1004 includes n pairs of sensing elements 1012a-1012n. The left most used pair of sensing elements 1012a is situated a distance X from the right most used pair of sensing elements 1012n. The left most pair of sensing elements 1012a includes a first top sensing element 1014a electrically coupled to a first bottom sensing element 1016a via conductive path 1018a. The next pair of sensing elements 1012b includes a second top sensing element 1014b electrically coupled to a second bottom sensing element 1016b via conductive path 1018b. The third pair of sensing elements 1012c includes a third top sensing element 1014c electrically coupled to a third bottom sensing element 1016c via conductive path 1018c. The fourth pair of sensing elements 1012d includes a fourth top sensing element 1014d electrically coupled to a fourth bottom sensing element 1016d via conductive path 1018d. Up to, the right most pair of sensing elements 1012n includes a right most top sensing element 1014n electrically coupled to a right most bottom sensing element 1016n via conductive path 1018n. In one embodiment, the distance X between the left most and right most used pairs of sensing elements 1012a and 1012n is one fourth the pole-pitch, i.e. one half the length L of one of the encoder segments 1006. In one embodiment, the distance X between the left most and right most used pairs of sensing elements 1012a and 1012n is one half the pole-pitch, i.e. the length L of one of the encoder segments 1006. In one embodiment, the distance X between the left most and right most used pairs of sensing elements 1012a and 1012n is equal to (n−1)/n times one fourth the pole-pitch. In one embodiment, the distance X between the left most and right most used pairs of sensing elements 1012a and 1012n is equal to (n−1)/n times one half the pole-pitch.

Top sensing elements 1014a-1014n are situated along the top of sensor circuit 1004, from the left corner to the right corner of sensor circuit 1004, and bottom sensing elements 1016a-1016n are situated along the bottom of sensor circuit 1004, from the left corner to the right corner of sensor circuit 1004. Each of the sensing elements 1014a-1014n and 1016a-1016n is situated along a radius from the axis of rotation at 1008. Sensor circuit 1004 is situated in an upright position, such that top sensing elements 1014a-1014n are radially further away from the axis of rotation at 1008 than bottom sensing element 1016a-1016n. The rectangular shapes of the sensing elements 1014a-1014n and 1016a-1016n denote the area of the sensing elements. In one embodiment, at least one of the sensing elements 1014a-1014n and 1016a-1016n is a single strip. In one embodiment, at least one of the sensing elements 1014a-1014n and 1016a-1016n is a meandering strip.

In operation, encoder wheel 1002 rotates to change the magnetic field between encoder wheel 1002 and sensor circuit 1004. The magnetic field is sensed via the multiple pairs of sensing elements 1012a-1012n. Each time a crossing point, such as a transition, on encoder wheel 1002 passes under one of the pairs of sensing elements 1012a-1012n, a zero or crossing point is provided from sensor circuit 1004. As the crossing point passes the pairs of sensing elements 1012a-1012n, a series of crossing points are provided via sensor circuit 1004 and the pairs of sensing elements 1012a-1012n. This provides a finer improved angular resolution.

In one embodiment, the distance X is equal to one fourth the pole-pitch, i.e. one half the length L of one of the encoder segments 1006, such that if the left most pair of sensing elements is at a zero, the right most pair of sensing elements is at a minimum or a maximum, and if the left most pair of sensing elements is at a minimum or a maximum, the right most pair of sensing elements is at a zero. In one embodiment, the distance X is equal to (n−1)/n times one fourth the pole-pitch, such that if the right most pair of sensing elements is at a zero, the next value sensed via the left most pair of sensing elements as encoder wheel 1002 continues to rotate is a minimum or a maximum, and if the right most pair of sensing elements is at a minimum or a maximum, the next value sensed via the left most pair of sensing elements as encoder wheel 1002 continues to rotate is a zero.

In one embodiment, the distance X is equal to one half the pole-pitch, i.e. one length L of one of the encoder segments 1006, such that if the left most pair of sensing elements is at a zero, the right most pair of sensing elements is at a zero, and if the left most pair of sensing elements is at a minimum or a maximum, the right most pair of sensing elements is at a minimum or a maximum. In one embodiment, the distance X is equal to (n−1)/n times one half the pole-pitch, such that if the right most pair of sensing elements is at a zero, the next value sensed via the left most pair of sensing elements as encoder wheel 1002 continues to rotate is a zero, and if the right most pair of sensing elements is at a minimum or a maximum, the next value sensed via the left most pair of sensing elements as encoder wheel 1002 rotates is a minimum or a maximum.

The distance X corresponds to pole pitch and segment length L of the encoder wheel, such as encoder wheel 1002. If all of the sensing elements 1012a-1012n are used, the distance X from the left most to the right most used sensing elements 1012a-1012n is at a maximum and an encoder wheel with a larger pole pitch and segment lengths is used. Larger air-gaps or distances D can be used with larger pole pitches. If one or more of the last sensing elements 1012a-1012n are not used, the distance X from the left most to the right most used sensing elements 1012a-1012n is reduced and an encoder wheel with a smaller pole pitch and segment lengths is used. Thus, different encoder wheels can be used with the same sensor circuit 1004.

In one embodiment, each of the pairs of sensing elements 1012a-1012b is part of a quarter bridge comparator circuit for detecting changes in the magnetic field between encoder wheel 1002 and sensor circuit 1004. In one embodiment, each of the pairs of sensing elements 1002 is part of a comparator circuit similar to comparator circuit 820.

Figure 22:
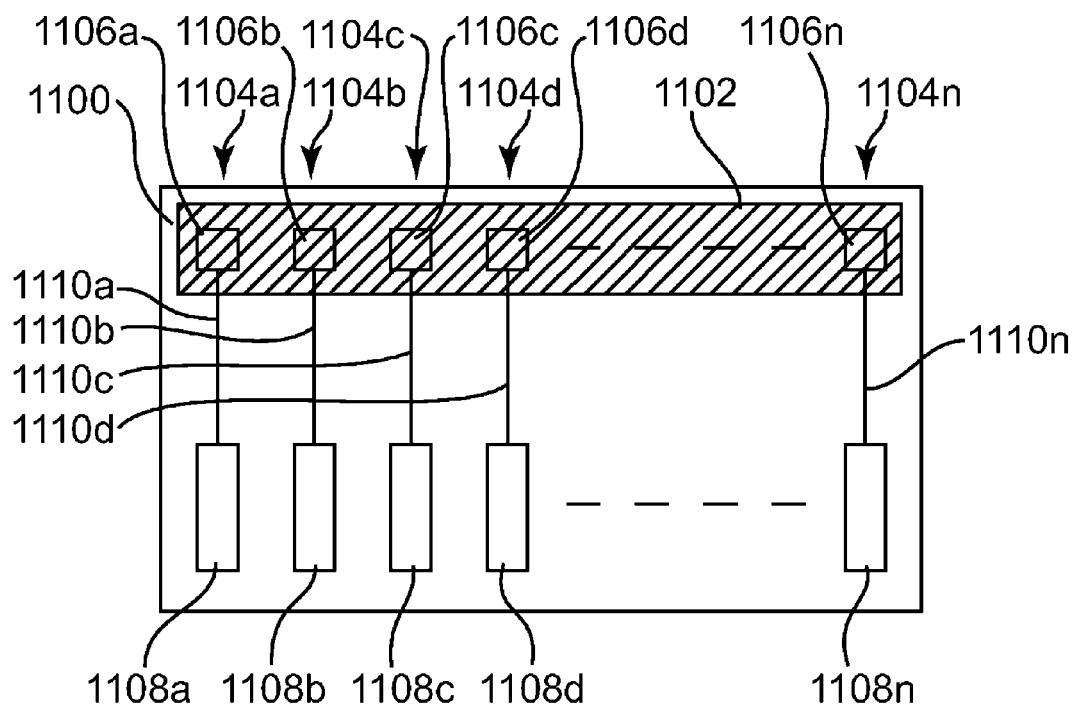
FIG. 22 is a diagram illustrating one embodiment of a sensor circuit that includes a shielding layer.

FIG. 22 is a diagram illustrating one embodiment of a sensor circuit 1100 including a shielding layer 1102. Sensor circuit 1100 includes n pairs of sensing elements 1104a-1104n. The left most pair of sensing elements 1104a includes a first top sensing element 1106a electrically coupled to a first bottom sensing element 1108a via conductive path 1110a. The next pair of sensing elements 1104b includes a second top sensing element 1106b electrically coupled to a second bottom sensing element 1108b via conductive path 1110b. The third pair of sensing elements 1104c includes a third top sensing element 1106c electrically coupled to a third bottom sensing element 1108c via conductive path 1110c. The fourth pair of sensing elements 1104d includes a fourth top sensing element 1106d electrically coupled to a fourth bottom sensing element 1108d via conductive path 1110d. Up to, the right most pair of sensing elements 1104n includes a right most top sensing element 1106n electrically coupled to a right most bottom sensing element 1108n via conductive path 1110n.

Shielding layer 1102 is applied over top sensing elements 1106a-1106n. Shielding layer 1102 is a soft magnetic layer that shields top sensing elements 1106a-1106n from magnetic fields, including the magnetic field between sensor circuit 1100 and an encoder wheel (not shown). Sensor circuit 1100 with shielding layer 1102 is a general purpose sensor that can be used as a face down sensor circuit or an upright position sensor circuit.

In a sensor system, the encoder wheel is situated above or below the plane of the page and the axis of rotation of the encoder wheel is parallel with conductive paths 1110a-1110n. The pairs of sensing elements 1104a-1104n are situated along the direction of rotation of the encoder wheel.

In operation, the encoder wheel rotates to change the magnetic field between sensor circuit 1100 and the encoder wheel. The shielded top sensing elements 1106a-1106n provide reference resistances and crossing points are detected via changes in the resistances of bottom sensing elements 1108a-1108n.

Figure 23:
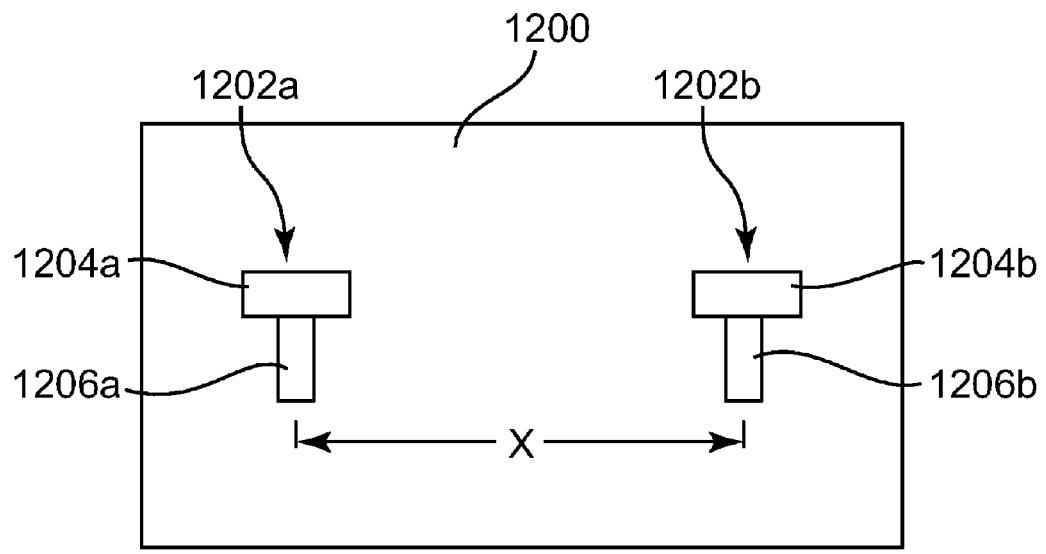
FIG. 23 is a diagram illustrating one embodiment of a facedown sensor circuit that doubles angular resolution.

FIG. 23 is a diagram illustrating one embodiment of a face down sensor circuit 1200 that doubles angular resolution. Sensor circuit 1200 includes two pairs of sensing elements 1202a and 1202b. The left most pair of sensing elements 1202a includes a first top sensing element 1204a electrically coupled to a first bottom sensing element 1206a, and the right most sensing element 1202b includes a second top sensing element 1204b electrically coupled to a second bottom sensing element 1206b. The two pairs of sensing elements 1202a and 1202b are separated a distance X that is one fourth the pole-pitch, i.e. one half the length of one of the encoder segments of an encoder wheel (not shown).

Each of the top sensing elements 1204a and 1204b is magnetized to detect a magnetic field in a first direction and each of the bottom sensing elements 1206a and 1206b is magnetized to detect a magnetic field in a second direction that is 90 degrees from the first direction. In one embodiment, each of the top sensing elements 1204a and 1204b is magnetized to detect a magnetic field in the z direction, i.e. perpendicular to the die surface of sensor circuit 1200, and each of the bottom sensing elements 1206a and 1206b is magnetized to detect a magnetic field in the x direction. In other embodiments, the top sensing elements 1204a and 1204b are covered with a soft magnetic material to shield the top sensing elements 1204a and 1204b from the magnetic fields.

In a sensor system including sensor circuit 1200, the encoder wheel is situated above or below the plane of the page and the axis of rotation of the encoder wheel is parallel with the plane of the page. Also, the pairs of sensing elements 1202a and 1202b are situated along the direction of rotation of the encoder wheel.

In operation, the encoder wheel rotates to change the magnetic field between the encoder wheel and sensor circuit 1200. The magnetic field is sensed via the first pair of sensing elements 1202a and the second pair of sensing elements 1202b, which are separated the distance X that is one fourth the pole-pitch, i.e. one half the length of one of the encoder segments of the encoder wheel. Each time a crossing point, such as a transition, on the encoder wheel passes under one of the pairs of sensing elements 1202a and 1202b to provide a zero or cross-over, the other pair of sensing elements 1202a and 1202b senses a minimum or a maximum. This effectively doubles the angular resolution of the encoder wheel as compared to the angular resolution in a system that uses the same encoder wheel and a sensor circuit with only one sensing element or one sensing element pair.

In other embodiments, sensor circuit 1200 can be used with an encoder wheel having twice the pole pitch of another encoder wheel to attain the same angular resolution obtained via one sensing element or one sensing element pair and the other encoder wheel. In a system having twice the pole pitch, the air-gap or distance can be increased between the encoder wheel and sensor circuit 1200.

In one embodiment, each of the pairs of sensing elements 1202a and 1202b is part of a quarter bridge comparator circuit for detecting changes in the magnetic field between the encoder wheel and sensor circuit 1200. In one embodiment, each of the pairs of sensing elements 1202a and 1202b is part of a comparator circuit similar to comparator circuit 820.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A system comprising:
    an encoder having a perimeter and encoder segments around the perimeter and configured to rotate in a direction of rotation via an axis of rotation;
    a sensor comprising:
        a first sensing element; and
        a second sensing element, wherein the first sensing element is situated radially further from the axis of rotation than the second sensing element and the second sensing element is situated radially further from the axis of rotation than the perimeter.

2. The system of claim 1, wherein the first sensing element and the second sensing element are situated along the same radius from the axis of rotation.

3. The system of claim 1, comprising a third sensing element, wherein the third sensing element is situated radially further from the axis of rotation than the second sensing element.

4. The system of claim 1, wherein the encoder has a pole pitch and comprising:
pairs of sensing elements situated along the direction of rotation and including a first pair of sensing elements and a second pair of sensing elements spaced apart less than or equal to a quarter of the length of the pole pitch.

5. The system of claim 4, wherein one of the pairs of sensing elements includes the first sensing element and the second sensing element and another one of the pairs of sensing elements comprises:
a third sensing element; and
a fourth sensing element, wherein the third sensing element is situated radially further from the axis of rotation than the fourth sensing element.

6. A method of sensing comprising:
providing an encoder having a perimeter and encoder segments around the perimeter and configured to rotate in a direction of rotation via an axis of rotation;
sensing via a first sensing element; and
sensing via a second sensing element that is radially closer to the axis of rotation than the first sensing element and radially further from the axis of rotation than the perimeter.

7. The method of claim 6, comprising:
sensing via pairs of sensing elements situated along the direction of rotation and including a first pair of sensing elements and a second pair of sensing elements spaced apart less than or equal to a quarter of the length of the pole pitch.

8. The method of claim 7, wherein sensing comprises:
sensing via one of the pairs of sensing elements that includes the first sensing element and the second sensing element; and
sensing via another one of the pairs of sensing elements that includes a third sensing element and a fourth sensing element that is radially closer to the axis of rotation than the third sensing element.

9. A system comprising:
an encoder having encoder segments around a circumference and configured to rotate in a direction of rotation via an axis of rotation, wherein the encoder segments affect a magnetic field that is radially further from the axis of rotation than the circumference;
a sensor comprising:
a first sensing element configured to sense the magnetic field; and
a second sensing element configured to sense the magnetic field, wherein the first sensing element is situated radially further from the axis of rotation than the second sensing element.

10. The system of claim 9, wherein the first sensing element and the second sensing element are situated along the same radius from the axis of rotation.

11. The system of claim 9, wherein the first sensing element and the second sensing element are situated along different radii from the axis of rotation.

12. The system of claim 9, wherein the first sensing element is longer than the second sensing element along the direction of rotation.

13. The system of claim 9, comprising a third sensing element, wherein the third sensing element is situated radially further from the axis of rotation than the second sensing element.

14. A system comprising:
an encoder having a perimeter and a pole pitch and configured to rotate in a direction of rotation via an axis of rotation;
a sensor comprising pairs of sensing elements situated along the direction of rotation and including a first pair of sensing elements and a second pair of sensing elements spaced apart less than or equal to one half the pole pitch along the direction of rotation.

15. The system of claim 14, wherein each of the pairs of sensing elements includes a first sensing element and a second sensing element that is situated radially closer to the axis of rotation than the first sensing element.

16. The system of claim 14, wherein each of the pairs of sensing elements includes a first sensing element and a second sensing element at the same position along the perimeter of the encoder.

17. A system comprising:
an encoder having a perimeter and a pole pitch and configured to rotate in a direction of rotation via an axis of rotation;
a sensor comprising pairs of sensing elements situated along the direction of rotation and including a first pair of sensing elements and a second pair of sensing elements, wherein each of the pairs of sensing elements includes a first sensing element and a second sensing element that is situated radially closer to the axis of rotation than the first sensing element.

18. The system of claim 17, wherein the second sensing element is situated radially further from the axis of rotation than the perimeter.

19. The system of claim 17, wherein the first pair of sensing elements and the second pair of sensing elements are spaced apart less than or equal to one half the pole pitch along the direction of rotation.

20. A method of sensing comprising:
providing an encoder having a perimeter and a pole pitch and configured to rotate in a direction of rotation via an axis of rotation;
sensing via pairs of sensing elements situated along the direction of rotation and including a first pair of sensing elements and a second pair of sensing elements, wherein sensing via each of the pairs of sensing elements comprises:
sensing via a first sensing element that is radially further from the axis of rotation than a second sensing element.

21. The method of claim 20, wherein sensing via each of the pairs of sensing elements comprises:
sensing via the second sensing element that is situated radially further from the axis of rotation than the perimeter.

22. The method of claim 20, wherein sensing via pairs comprises:
sensing via the first pair of sensing elements and the second pair of sensing elements, which are spaced apart less than or equal to one half the pole pitch along the direction of rotation.

* * * * *